United States Patent
Alaimo et al.

(10) Patent No.: US 12,040,598 B2
(45) Date of Patent: *Jul. 16, 2024

(54) MOBILE DEVICE INCLUDING LASER-PUMPED PHOSPHOR LIGHT SOURCE

(71) Applicant: Apple Inc., Cupertino, CA (US)

(72) Inventors: Angelo M. Alaimo, San Francisco, CA (US); Richard L. Baer, Los Altos, CA (US); Garam Young, Sunnyvale, CA (US); Florian R. Fournier, Cupertino, CA (US); Blake M. Coughenour, Sunnyvale, CA (US); Bryan Dang, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/301,087

(22) Filed: Apr. 14, 2023

(65) Prior Publication Data

US 2023/0299564 A1    Sep. 21, 2023

Related U.S. Application Data

(63) Continuation of application No. 16/908,339, filed on Jun. 22, 2020, now Pat. No. 11,658,465.

(60) Provisional application No. 62/865,904, filed on Jun. 24, 2019.

(51) Int. Cl.
  *H01S 5/323*    (2006.01)
  *H01S 5/00*    (2006.01)
  *H04N 23/56*    (2023.01)
  *H04N 23/74*    (2023.01)

(52) U.S. Cl.
  CPC ............ *H01S 5/323* (2013.01); *H01S 5/0087* (2021.01); *H04N 23/56* (2023.01); *H04N 23/74* (2023.01)

(58) Field of Classification Search
  CPC ..... H01S 5/323; H01S 5/0087; H04N 5/2256; H04N 5/2354; H04N 23/74; H04N 23/56
  See application file for complete search history.

(56) References Cited

U.S. PATENT DOCUMENTS

| | | | |
|---|---|---|---|
| 9,326,348 B2 | 4/2016 | Roshan et al. | |
| 9,952,442 B2 | 4/2018 | Wang et al. | |
| 10,183,613 B2 | 1/2019 | Schoemer et al. | |
| 10,879,673 B2 * | 12/2020 | Raring | H01S 5/34333 |
| 2018/0316160 A1 * | 11/2018 | Raring | H01S 5/02326 |
| 2018/0347773 A1 | 12/2018 | Bergenek et al. | |
| 2022/0030153 A1 | 1/2022 | Joo et al. | |

* cited by examiner

*Primary Examiner* — Nicholas G Giles
(74) *Attorney, Agent, or Firm* — Robert C. Kowert; Kowert, Hood, Munyon, Rankin & Goetzel, P.C.

(57) ABSTRACT

A mobile device includes a camera and a light source module embedded in the mobile device. The light source module includes at least a laser-pumped phosphor light source that includes a photoluminescent phosphor and a laser diode to generate laser light within a first wavelength range to pump the photoluminescent phosphor. Exposure of the photoluminescent phosphor to the laser light results in emission of visible light within a second wavelength range according to a laser-pumped emission spectrum associated with the photoluminescent phosphor.

20 Claims, 16 Drawing Sheets

MOBILE DEVICE INCLUDING LASER-PUMPED PHOSPHOR LIGHT SOURCE

This application is a continuation of U.S. patent application Ser. No. 16/908,339, filed Jun. 22, 2020, which claims benefit of priority to U.S. Provisional Application No. 62/865,904, filed Jun. 24, 2019, titled "Mobile Device Including Laser-Pumped Phosphor Light Source", which are hereby incorporated by reference in their entirety.

BACKGROUND

Technical Field

This disclosure relates generally to light source modules, including, without limitation, light source modules that include at least a laser-pumped phosphor light source.

Description of the Related Art

For small devices, including devices which include one or more miniature cameras, it is common to include a flash, also referred to herein as a light source module, which illuminates at least a portion of a scene located within a field of view (FOV) of the camera. The field of view of a camera may be referred to herein as a "scene". Such cameras and light source modules can be included in a larger electronic device, including a mobile electronic device, which can include a mobile telephone, smartphone, notebook, etc.

The light source module, which can include a camera "flash" module can emit light which illuminates a space external to the light source module and can include the camera field of view, thereby illuminating subjects within the camera field of view for images of said subjects captured by the camera.

In some cases, the light source module included in a small device includes a light source which includes one or more illumination elements, such as a light emitting diode (LED), a laser diode, or a combination thereof. LEDs can emit light within the visible spectrum. This light may be various colors dependent on the semiconductor material properties such as InGaN emitting blue light and GaAs emitting red light. This light may also be generated through a phosphor conversion of higher energy light into lower energy light or over a broad spectrum generating an emission of white light. This method is commonly referred to as downconversion or phosphor converted white light. Phosphor converted white light may also be generated from higher energy laser diodes, such as laser diodes operating with a near ultraviolet (UV) or blue pump wavelength.

SUMMARY OF EMBODIMENTS

Some embodiments provide a mobile device which includes a camera and a light source module embedded in the mobile device. The light source module includes one or more light sources, including at least a laser-pumped phosphor light source. The laser-pumped phosphor light source includes a photoluminescent phosphor and a laser diode to generate laser light within a first wavelength range to pump the photoluminescent phosphor. Exposure of the photoluminescent phosphor to the laser light results in emission of visible light within a second wavelength range according to a laser-pumped emission spectrum associated with the photoluminescent phosphor.

Some embodiments provide a light source module for a camera. The light source module includes a laser-pumped phosphor light source and one or more LED light sources. The laser-pumped phosphor light source includes a photoluminescent phosphor and a laser diode to generate laser light within a first wavelength range to pump the photoluminescent phosphor. Exposure of the photoluminescent phosphor to the laser light results in emission of visible light within a second wavelength range according to a laser-pumped emission spectrum associated with the photoluminescent phosphor. The one or more LED light sources are configured to generate LED light according to respective LED emission spectrums.

Some embodiments provide a method performed by a mobile device. The method includes activating a light source module embedded in the mobile device. The light source module includes a laser-pumped phosphor light source of a plurality of light sources. The laser-pumped phosphor light source includes a photoluminescent phosphor and a laser diode, in which the laser diode is configured to generate laser light within a first wavelength range to pump the photoluminescent phosphor. The method includes determining, based on ambient light information captured by a sensor associated with a camera embedded in the mobile device, whether the laser-pumped phosphor light source is to be utilized for illumination. Responsive to determining that the laser-pumped phosphor light source is to be utilized for illumination, the method further includes causing the laser diode to generate the laser light to pump the photoluminescent phosphor. Exposure of the photoluminescent phosphor to the laser light results in emission of visible light within a second wavelength range according to a laser-pumped emission spectrum associated with the photoluminescent phosphor.

Figure 1A:
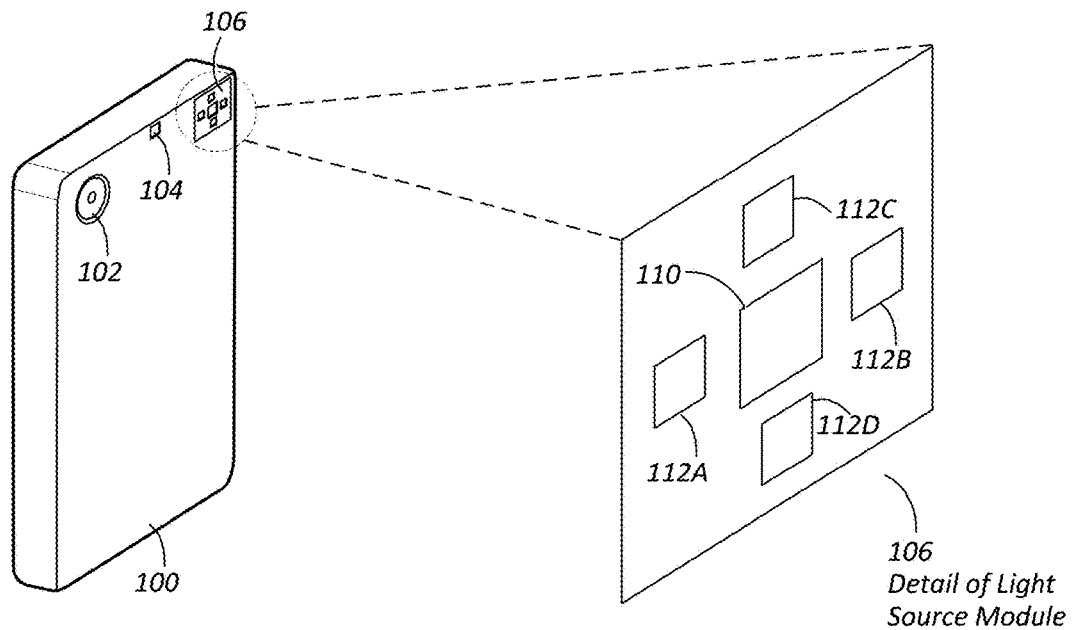
FIG. 1A illustrates a mobile device that includes a camera and an embedded light source module which includes one or more light sources, including at least a laser-pumped phosphor light source, according to some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . " Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

DETAILED DESCRIPTION

Introduction

The present disclosure describes a light source module for a camera, where the light source module includes at least a laser-pumped phosphor light source. As used herein, the term "laser-pumped phosphor light source" refers to a light source (also referred to as "an illumination element") that includes at least a laser light source (e.g., a laser diode) and a photoluminescent phosphor. The laser diode of the laser-pumped phosphor light source is configured to generate laser light within a first wavelength range. The laser light represents higher energy light that may be utilized to generate light within the visible spectrum through a phosphor conversion of the higher energy light into lower energy light or over a broad spectrum generating an emission of white light. In the present disclosure, the laser light within the first wavelength range includes an excitation wavelength associated with a particular photoluminescent phosphor, which excites (also referred to herein as "pumps") the particular photoluminescent phosphor. Exposure of the particular photoluminescent phosphor to the laser light results in emission of visible light within a second wavelength range according to a particular laser-pumped emission spectrum associated with the particular photoluminescent phosphor. According to some embodiments, the laser light is within the ultraviolet (UV) spectrum (also referred to herein as "UV light"), which may be advantageous to prevent speckle (interference patterns) associated with lasers that pump in the near-UV or blue wavelength ranges.

In various embodiments, the light source module may include one or more additional light sources. In a particular embodiment, the additional light source(s) may include one or more LED light sources that generate LED light according to respective LED emission spectrums. Illustrative, non-limiting examples of such LED light sources include an InGaN-type LED for emitting blue light or a GaAs-type LED for emitting red light, among numerous other alternatives. In some embodiments, both the laser-pumped phosphor light source and the LED light source(s) could be employed to enable the light source module to be used as a flashlight or compact photographic flash module in a mobile device, such as in a digital still camera, in a mobile phone, or in other devices containing compact camera modules.

In some embodiments, it may be beneficial to have multiple LEDs or laser diodes of multiple colors to improve color rendering or to be able to tune the light by varying the ratio of brightness between multiple color light sources. In some other embodiments, it may be beneficial to have a laser-pumped phosphor light source as one light source and other light sources within the same light source module such as one or more LEDs working together to generate a tunable color. In some cases, the laser-pumped phosphor light source may represent a main source of white light, and the individual LEDs could be used as another color to add other shades of white light or other color to produce tunable light.

Optics may be used to collimate or otherwise direct the visible light emitted by the photoluminescent phosphor of the laser-pumped phosphor light source and/or the LED light from the LEDs. In some embodiments, it may be beneficial to direct the visible light and the LED light over the same spatial area or separately depending on the requirements for a particular photographic application. In some embodiments, it may be beneficial to scan a beam of light from a laser light source and/or a beam of light from an LED light source over a spatial area. In a particular embodiment, this light may be steered with an actuator to tilt or translate the light source or optics. The beam could be a shape like a line, square, circle, or other shape.

Thus, the present disclosure relates to a light source module for a camera, such as a light source module embedded in a mobile device. As described further herein, various types of light sources could be employed in a light source module which may be used as a flashlight or compact photographic flash module in a digital still camera, a mobile phone, or other devices containing compact camera modules. Such a light source module may either work simultaneously, sequentially, or separately to illuminate a flat field area with light for the purpose of a photographic flash for a mobile phone or other device. In some embodiments of the light source module of the present disclosure, a combination of visible light emitted by the photoluminescent phosphor of the laser-pumped phosphor light source and LED light can be used to generate tunable white or other colored light.

Various potential benefits may be associated with an illumination system that includes a laser light source. As a first example, a laser light source provides better efficiency when high current is applied and bright scene illumination is desired. As a second example, the spatial and angular extent of a laser beam is typically smaller than light emitted by an LED, which enables smaller optic and/or higher illuminance uniformity compared to an LED-based flash module. As a third example, a laser light source may provide features not available using an LED light source, such as larger illumination field-of-view (FOV) or visual field indicator (VFI).

According to some embodiments, a single element freeform lens can be designed with a laser light source for each application. Alternatively, multiple optics can be designed with one laser light source, and steering capabilities enable pumping of different spatial locations of the photoluminescent phosphor associated with different optics.

Example Mobile Device Including Laser-Pumped Phosphor Light Source

In some embodiments, a light source module may be embedded in a mobile device and may provide light to illuminate a scene to be captured by a camera or video recorder of the mobile device. For example, FIG. 1A illustrates a mobile device 100 with a camera 102, a sensor 104, and an embedded light source module 106. In some embodiments, the sensor 104 may be a light sensor that can detect ambient lighting conditions. In some embodiments, the sensor 104 may also detect subjects in a scene and distances from the mobile device 100 to detected subjects. A controller (e.g., the controller 405 described further herein with respect to FIG. 4) may use information from the camera 102, the sensor 104, and (optionally) user inputs to the mobile device 100 to control light emitted from one or more light sources of the light source module 106, with the one or more light sources including at least a laser-pumped phosphor light source 110. In the particular embodiment depicted in FIG. 1A, the light source module 106 further includes additional light sources, including four LED light sources 112A-D that are arranged to form an array (as illustrated and further described herein with respect to FIGS. 2A-C).

Figure 1B:
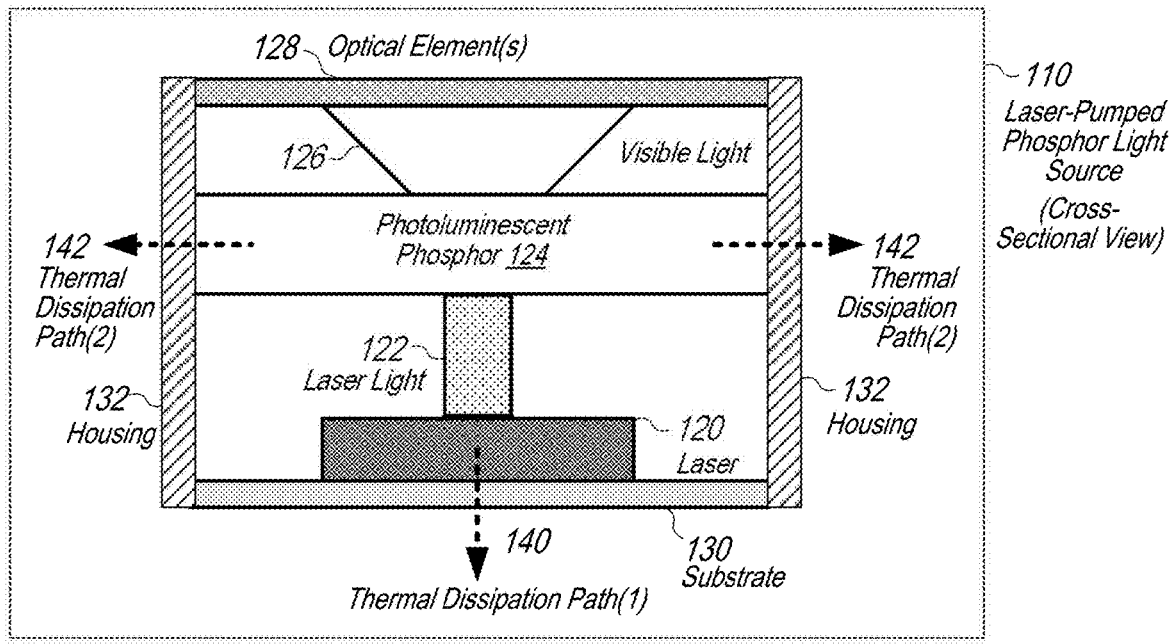
FIG. 1B illustrates a cross-sectional view of a portion of a first example design for the laser-pumped phosphor light source of FIG. 1A, according to some embodiments.

FIG. 1B depicts a cross-sectional view of a selected portion of the light source module 106 of FIG. 1A, corresponding to one embodiment of a design for the laser-pumped phosphor light source 110. A combination of a laser diode 120 and a photoluminescent phosphor 124 may form the laser-pumped phosphor light source 110 (e.g., for incorporation into the light source module 106 depicted in FIG. 1A). The laser diode 120 is configured to generate laser light 122 within a first wavelength range to pump the photoluminescent phosphor 124. Exposure of the photoluminescent phosphor 124 to the laser light 122 in transmission results in emission of visible light 126 within a second wavelength range according to a laser-pumped emission spectrum associated with the photoluminescent phosphor 124. In the embodiment depicted in FIG. 1B, the phosphor light conversion occurs primarily within the volume of the photoluminescent phosphor 124 and the visible light 126 transmitting through the photoluminescent phosphor 124 then reaches the optical element(s) 128.

Figure 1C:
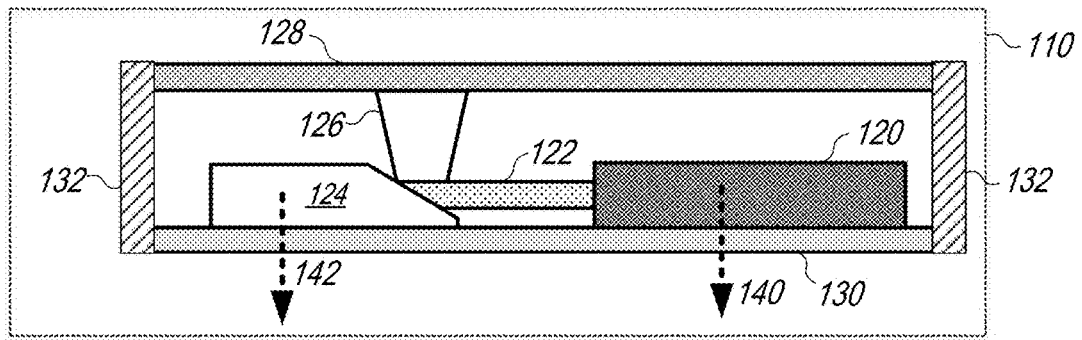
FIG. 1C illustrates a cross-sectional view of a second example design for the laser-pumped phosphor light source of FIG. 1A, according to some embodiments.

FIG. 1C depicts a cross-sectional view of a selected portion of the light module 106 of FIG. 1A, corresponding to an alternative embodiment of a design for the laser-pumped phosphor light source 110. In the embodiment depicted in FIG. 1C, exposure of the photoluminescent phosphor 124 to the laser light 122 in reflection results in emission of visible light 126 within the second wavelength range according to the laser-pumped emission spectrum associated with the photoluminescent phosphor 124. In the embodiment depicted in FIG. 1C, the phosphor light conversion occurs primarily at the surface of the photoluminescent phosphor 124 and the visible light 126 reflecting off this surface then reaches the optical element(s) 128.

The photoluminescent phosphor 124 may correspond to a variety of materials having various excitation wavelengths. Additionally, the laser diode 120 may correspond to a variety of lasers designed to generate a beam of laser light within a particular wavelength range that includes a particular excitation wavelength associated with a selected photoluminescent phosphor. As described further herein, there may be advantages associated with the laser light 122 being within the UV spectrum, including no speckle and high color quality (compared to other lasers that operate in the near-UV or blue wavelengths). As described further herein with respect to FIG. 3, a variety of photoluminescent phosphor materials have excitation wavelengths within the UV spectrum, and a corresponding laser diode may be selected that is capable of generating UV laser light to pump a selected photoluminescent phosphor material.

With respect to module integration, a light source module containing a laser-pumped phosphor light source (e.g., the laser-pumped phosphor light source 110 depicted in FIGS. 1B/1C) may include a substrate 130 or printed circuit board containing the laser diode 120. One purpose of the substrate 130 is to electrically connect to the laser diode 120 but also to provide a thermal dissipation path 140 (identified as "Thermal Dissipation Path (1)") for excess heat generated by the laser diode 120. As illustrated in FIGS. 1B/1C, the photoluminescent phosphor 124 is to be mechanically separated from the laser diode 120. The separation enables dissipation of heat from the laser diode 120 via the thermal dissipation path 140 and enables dissipation of heat from the photoluminescent phosphor 124 via a different thermal dissipation path 142 (identified as "Thermal Dissipation Path (2)"). In the embodiment depicted in FIG. 1B, the laser-pumped phosphor light source 110 may be enclosed within a housing 132, and the housing 132 may be utilized as the thermal dissipation path 142 to remove excess heat from the photoluminescent phosphor 124. FIG. 1C illustrates an embodiment in which one thermal dissipation path 140 corresponds to one region of the substrate 130 adjacent to the laser diode 120, and the other thermal dissipation path 142 corresponds to a different region of the substrate 130 adjacent to the photoluminescent phosphor 124.

FIGS. 1B/1C further illustrate that one or more optical elements 128 may be placed over the laser diode 120 and the photoluminescent phosphor 124 and attached to the substrate 130 (e.g., via enclosure within the housing 132). One purpose of the optical element(s) 128 would be to shape the light output of the light source module 106. With respect to light steering, while not shown in FIGS. 1B/1C, a direction control component may shift a spatial orientation of the photoluminescent phosphor 124 with respect to the optical element(s) 128 to provide light directionality, according to some embodiments. The shift of the spatial orientation may enable steering of the visible light 126 toward the optical element(s) 128. The photoluminescent phosphor 124 could be combined with a mirror or other reflective surface to augment this steer-ability, according to some embodiments.

Example Light Source Module Including Laser-Pumped Phosphor Light Source

Figure 2A:
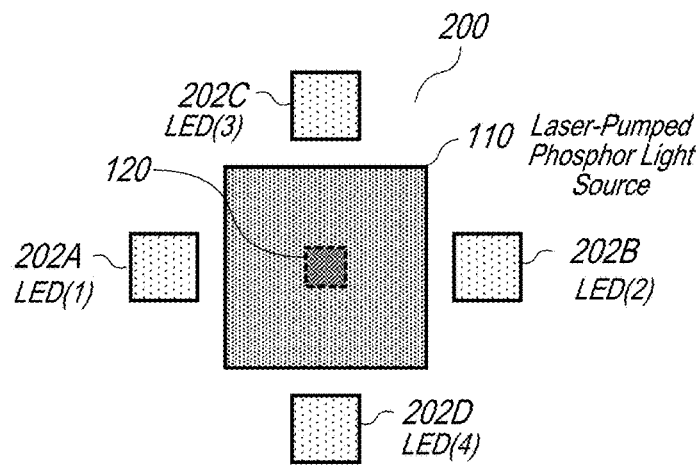
FIG. 2A illustrates a top view of an example of a design for an array that includes a laser-pumped phosphor light source and multiple LEDs, according to some embodiments.

FIG. 2A illustrates a top view of an example of a design for an array 200 that includes the laser-pumped phosphor light source 110 and multiple additional light sources, according to some embodiments. In the illustrative, non-limiting example depicted in FIG. 2A, the laser-pumped phosphor light source 110 including the underlying laser diode 120 (as shown in FIGS. 1B/1C) is illustrated. The optical element(s) 128 associated with the laser-pumped phosphor light source 110 (as shown in FIGS. 1B/1C) are omitted from view in FIG. 2A but included in the top view depicted in FIG. 2B.

The laser-pumped phosphor light source 110 represents a first light source that forms a central element (e.g., with a four-sided square/rectangular shape) of the array 200, with multiple LEDs positioned adjacent to the central element. In the embodiment depicted in FIG. 2A, four LEDs are positioned adjacent to the central element, including a first LED 202A positioned adjacent to a left side of the central element (from the top-view perspective), a second LED 202B positioned adjacent to a right side of the central element, a third LED 202C positioned adjacent to a top side of the central element, and a fourth LED 202D positioned adjacent to a bottom side of the central element. It will be appreciated that the example arrangement depicted in the array 200 of FIG. 2A is for illustrative purposes only. Alternative array designs may include an alternative number and/or type of light sources, an alternative positioning of the various light sources, an alternative shape for the various light sources, or various combinations thereof.

The multiple LEDs 202A-D of the array 200 may be configured to generate LED light according to respective LED emission spectrums. To illustrate, the first LED 202A may be configured to generate LED light within a third wavelength range (that is different from the first wavelength range associated with the laser light 122 and the second wavelength range associated with the visible light 126, as described with respect to FIGS. 1B/1C) according to a first LED emission spectrum. The second LED 202B may be configured to generate LED light within a fourth wavelength range according to a second LED emission spectrum. The third LED 202C may be configured to generate LED light within a fifth wavelength range according to a third LED emission spectrum. The fourth LED 202D may be configured to generate LED light within a sixth wavelength range according to a fourth LED emission spectrum. In some embodiments of the present disclosure, the visible light emitted according to the laser-pumped emission spectrum (e.g., the visible light 126 in FIGS. 1B/1C) and the LED light generated according to the respective LED emission spectrums may be utilized to generate tunable white or other colored light.

Figure 2B:
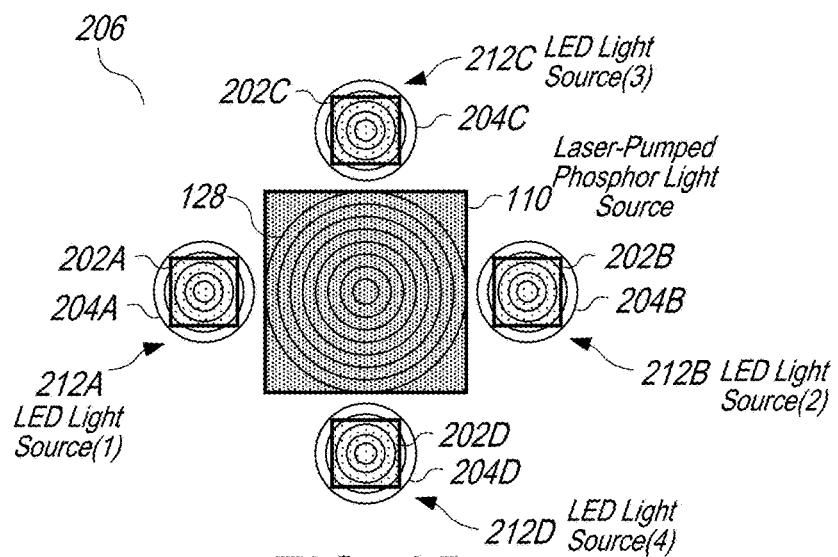
FIG. 2B illustrates a top view of a light source module corresponding to the array depicted in FIG. 2A, including optics associated with the laser-pumped phosphor light source and optics associated with the multiple LEDs, according to some embodiments.

FIG. 2B illustrates a top view of a light source module 206 corresponding to the array 200 depicted in FIG. 2A, including the optics associated with the laser-pumped phosphor light source 110 and optics associated with the LEDs 202A-D, according to some embodiments. In a particular embodiment, the light source module 206 depicted in FIG. 2B may correspond to the light source module 106 depicted in FIG. 1A.

The top view of FIG. 2B illustrates the optical element(s) 128 associated with the laser-pumped phosphor light source 110 (as depicted in the cross-sectional view of FIGS. 1B/1C). The optical element(s) 128 may be used to collimate or otherwise direct the visible light 126 emitted from the photoluminescent phosphor 124 of the laser-pumped phosphor light source 110. FIG. 2B further illustrates that optics 204A-D may be associated with each of the LEDs 202A-D of the array 200 to form LED light sources 212A-D. The optics 204A-D may be used to collimate or otherwise direct the LED light from the LEDs 202A-D. FIG. 2B illustrates that first optics 204A are added to the first LED 202A of the array 200 depicted in FIG. 2A, second optics 204B are added to the second LED 202B of the array 200, third optics 204C are added to the third LED 202C of the array 200, and fourth optics 204D are added to the fourth LED 202D of the array 200. The particular optics selected for addition to the individual LEDs 202A-D of the array 200 may depend on various factors, including a particular type of LED. As illustrative, non-limiting examples, the first LED 202A may correspond to an InGaN-type LED for emitting blue light, while the second LED 202B may correspond to a GaAs-type LED for emitting red light. In this case, the first optics 204A may be selected to collimate or otherwise direct the blue light from the first LED 202A, while the second optics 204B may be selected to collimate or otherwise direct the red light from the second LED 202B. In some cases, the first optics 204A selected for the first LED 202A may be the same as the second optics 204B selected for the second LED 202B. In other cases, the first optics 204A selected for the first LED 202A may be different from the second optics 204B selected for the second LED 202B. A similar optics selection process may be performed for optics 204C associated with the third LED 202C and the optics 204D associated with the fourth LED 202D of the array 200.

Figure 2C:
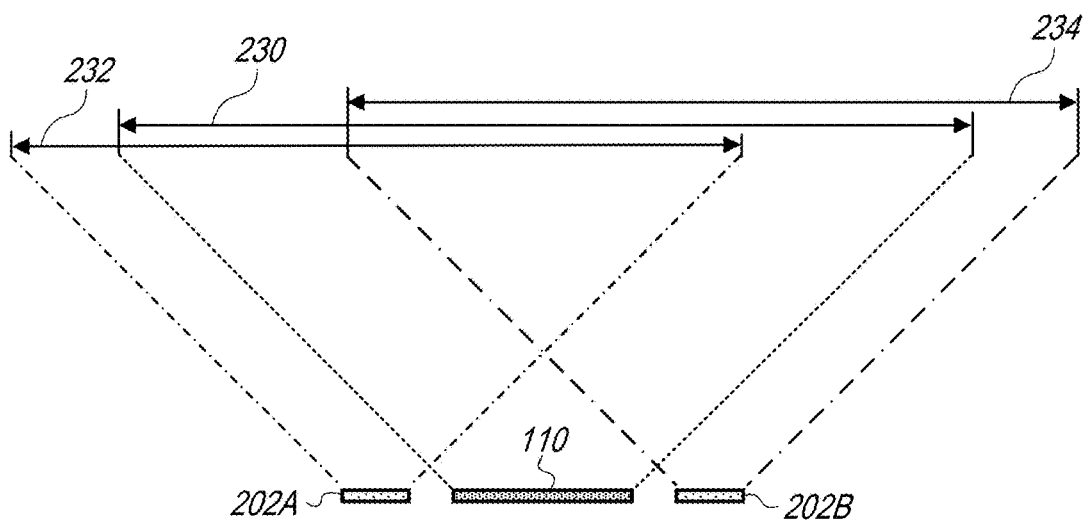
FIG. 2C depicts a side view of a portion of the light source module depicted in FIG. 2B to illustrate overlap of LED emission areas with a laser-pumped phosphor emission area for color rendering, according to some embodiments.

FIG. 2C depicts a side view of a portion of the light source module 206 depicted in FIG. 2B to illustrate overlap of LED emission areas with a laser-pumped phosphor emission area for color rendering, according to some embodiments. FIG. 2C illustrates an emission area 230 associated with the laser-pumped phosphor light source 110, a first LED emission area 232 associated with the first LED 202A of the array 200, and a second LED emission area 234 associated with the second LED 202B of the array 100. While not shown in the side view of FIG. 2C, a third LED emission area may be associated with the third LED 202C of the array 200, and fourth LED emission area may be associated with the fourth LED 202D of the array 200. It will be appreciated that the emission area 230 associated with the laser-pumped phosphor light source 110 may partially overlap with the LED emission areas associated with the third LED 202C and the fourth LED 202D. In some embodiments, the partial overlap of the various emission areas may be utilized for color rendering for illumination systems depending on the spectral content of the source. While FIG. 2C illustrates an example in which the emission areas 230-234 partially overlap, some embodiments may have optics in which the emission areas of the individual light sources fully overlap or even extend beyond the laser source, and may not necessarily partially overlap.

Color rendering for illumination systems depends on the spectral content of the source. An ideal light source would be one that contains equal relative power of all wavelengths of the visible spectrum. In photographic applications, it may be beneficial to have a light source like a photographic flash module that can match the spectrum of the ambient light in the scene being photographed. Various light sources may have different spectral content. To match the spectral content of various light sources, multiple light sources may be utilized. For cost, complexity or efficiency reasons, it may be preferable to use a mixture of LEDs and laser diodes. FIGS. 2A-2C illustrate an example of such a mixture of LEDs and laser diodes.

UV Laser-Pumped Phosphor Light Source Example

Figure 3:
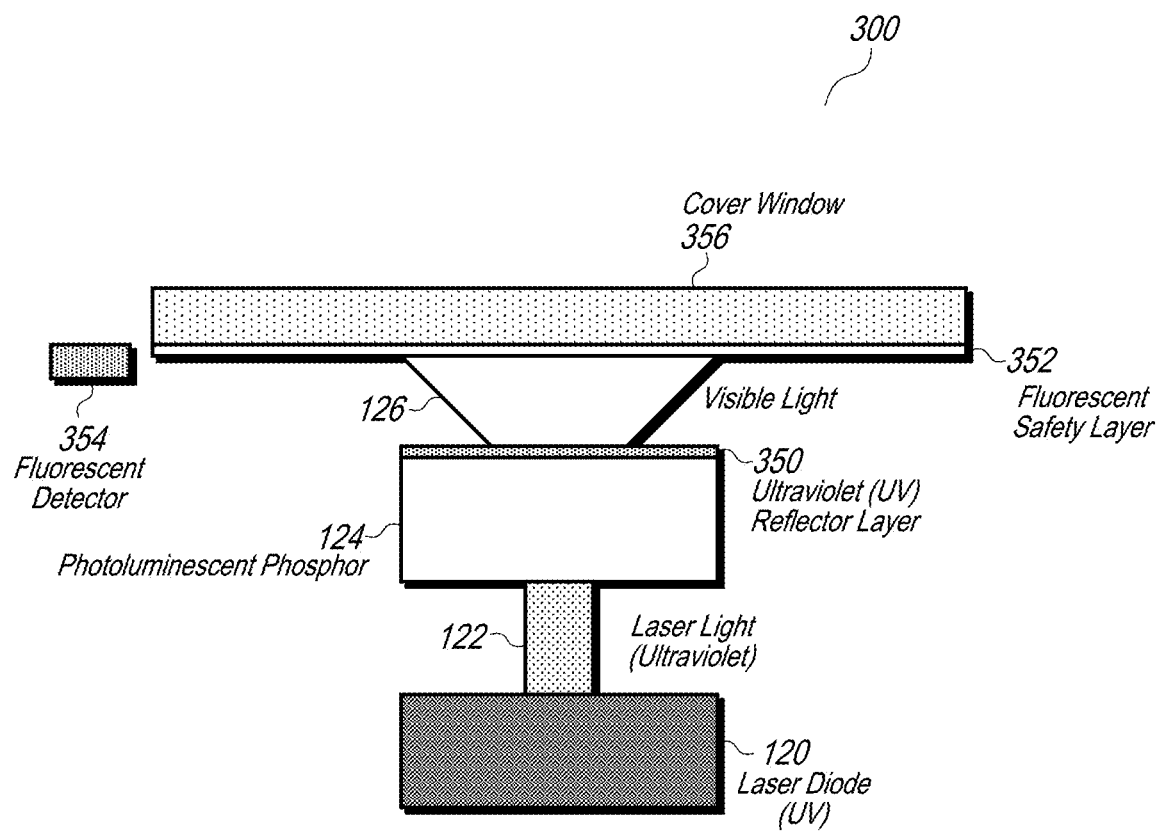
FIG. 3 depicts a side view of selected portions of an example of a design for a laser-pumped phosphor light source of a light source module, including a laser diode that generates laser light in the UV spectrum to pump a photoluminescent phosphor along with associated safety features to prevent UV leakage, according to some embodiments.

FIG. 3 depicts a side view 300 of a portion of an example design for a laser-pumped phosphor light source (e.g., the laser-pumped light source 110 depicted in FIGS. 1A-1C and FIGS. 2A-2C) in which the laser diode 120 emits laser light 122 within the UV spectrum, along with associated safety features to prevent UV leakage, according to some embodiments.

As described further herein with respect to FIGS. 1B/1C, a combination of the laser diode 120 and the photoluminescent phosphor 124 may form the laser-pumped phosphor light source 110 (e.g., for incorporation into the light source module 106 depicted in FIG. 1A). In FIG. 3, the laser diode 120 is configured to generate laser light 122 within the UV spectrum for pumping the photoluminescent phosphor 124. Exposure of the photoluminescent phosphor 124 to the laser light 122 within the UV spectrum results in emission of the visible light 126 according to a laser-pumped emission spectrum associated with the photoluminescent phosphor 124.

As described further herein, the photoluminescent phosphor 124 may correspond to a variety of materials having various excitation wavelengths within the UV spectrum. Additionally, the laser diode 120 may correspond to a variety of lasers designed to generate a beam of UV light that includes a particular UV excitation wavelength associated with a selected photoluminescent phosphor. As described further herein, a combination of a particular laser diode and a particular photoluminescent phosphor may be selected to cause emission of the visible light 126 according to a particular laser-pumped emission spectrum associated with the selected photoluminescent phosphor.

In some embodiments, the photoluminescent phosphor 124 may include a strontium aluminate (SRA) material that is activated with at least one dopant. For example, the at least one dopant may include a rare earth element, such as europium (Eu), dysprosium (Dy), or a combination thereof. In some embodiments, the SRA material may include $SrAl_2O_4$:Eu,Dy or $Sr_4Al_{14}O_{25}$:Eu,Dy. For these example SRA materials, an excitation wavelength may be within a range of 350 nm to 370 nm. In this case, the laser diode 120 may be selected that is capable of generating the laser light 122 within this UV light range.

In some embodiments, the SRA material may include a cerium (Ce) and manganese (Mn) doped strontium aluminate (Ce,Mn:$SrAl_{12}O_{19}$). For this example SRA material, an excitation wavelength may be within a range of 250 nm to 260 nm. In this case, the laser diode 120 may be selected that is capable of generating the laser light 122 within this UV light range.

In some embodiments, the photoluminescent phosphor 124 may include a europium (Eu) and manganese (Mn) doped barium magnesium aluminate ($BaMgAl_{10}O_{17}$:Eu,Mn). For this example material, an excitation wavelength may be less than 200 nm. In this case, the laser diode 120 may be selected that is capable of generating the laser light 122 within this UV light range.

It will be appreciated that the various examples of photoluminescent phosphors with excitation wavelengths within the UV spectrum are for illustrative purposes only and that numerous other types and/or combination of phosphors may be utilized.

Laser-pumped phosphor light sources used in the automotive industry rely on efficient blue lasers operating at about 450 nm (in the visible spectrum). Most of the blue energy in these sources comes directly from laser light that is not absorbed by the phosphor. Because it is monochromatic, speckle resulting from interference will be visible in the camera's blue channel as fine grain noise. Additionally, color reproduction is inaccurate because of weak emission at blue and blue-green wavelengths other than the pump wavelength. Materials whose spectral reflectances vary across these wavelengths are difficult to distinguish.

By contrast, in the present disclosure, such problems may be alleviated by pumping in the UV spectrum instead of the visible spectrum. In some embodiments of the present disclosure, a laser operating at a wavelength of 400 nm or less may be used to pump the phosphor with UV laser light. In this case, most of the laser light is absorbed and most of the blue energy comes from phosphor emission. An advantage associated with this approach is that there is no speckle, and the color quality is high. A disadvantage is that there is some loss in efficiency because of the larger difference of wavelength between the pump and the phosphor emission.

UV lasers are invisible, yet they can cause cornea damage. Because they are intrinsically more dangerous than visible lasers, extra safety measures may be appropriate. FIG. 3 depicts an example of a proposed safety scheme, according to one embodiment. First, a layer 350 (identified as "UV Reflector Layer" in FIG. 3) which passes the visible light 126 but which reflects the laser light 122 within the UV spectrum may be deposited on a top surface of the photoluminescent phosphor 124. This arrangement may increase the conversion efficiency while decreasing direct UV emission. Second, a layer 352 of material that fluoresces under UV illumination (but not visible), identified as "Fluorescent Safety Layer" in FIG. 3, may be deposited under a cover window 356. Leaking UV, caused for example by a cracked phosphor or a damaged reflector layer, would excite fluorescence in this layer 352, which could trigger a fluorescent detector 354 to shut down the laser diode 120. The components beneath the cover window 356 may be hermetically sealed, according to some embodiments. In FIG. 3, the optics (see e.g., the optical element(s) 128 in FIGS. 1B/1C) associated with the laser diode 120 are omitted from view. In some embodiments, the optics may be positioned above the cover window 356.

Control Methods

Figure 4:
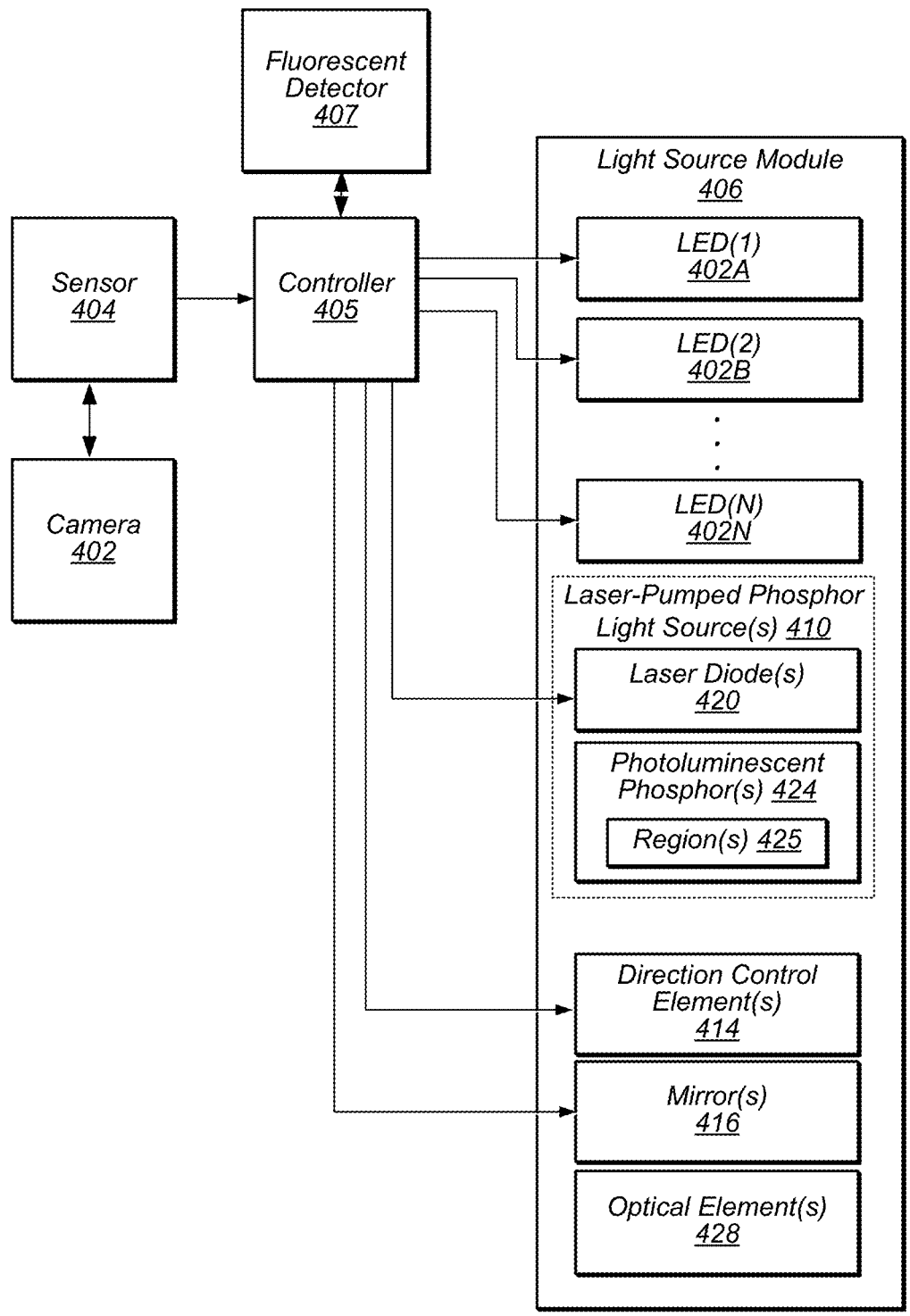
FIG. 4 depicts a flow chart for controlling a light source module for a camera, according to some embodiments.

FIG. 4 is a flowchart for controlling a light source module for a camera, according to some embodiments. In a particular embodiment, the flowchart depicted in FIG. 4 may be representative of a process for controlling the light source module 106 for the camera 102 of the mobile device 100 depicted in FIG. 1. Additionally, as illustrated and further described herein with respect to FIGS. 5A-C, the flowchart depicted in FIG. 4 may be representative of a particular embodiment of a process for steering laser light toward different regions of a photoluminescent phosphor associated with different optical elements in cases where the laser-pumped phosphor light source 110 includes multiple optical elements associated with a single laser light source. In some cases, one region may have a first phosphor characteristic, while another region may have a second phosphor characteristic that is different from the first phosphor characteristic.

FIG. 4 illustrates that a sensor associated with a camera 402, such as sensor 404, detects a condition of a scene to be illuminated by a light source module, such as light source module 406. In some embodiments, the light source module 406 of FIG. 4 may correspond to the light source module 106 of the mobile device 100 depicted in FIG. 1A, the camera 402 of FIG. 4 may correspond to the camera 102 of the mobile device 100 depicted in FIG. 1A, and the sensor 404 of FIG. 4 may correspond to the sensor 104 of the mobile device 100 depicted in FIG. 1A.

The sensor 404 communicates with a controller 405, and the controller 405 determines one or more light sources of the light source module 406 to illuminate based on program instructions and the one or more signals from the sensor 404. The sensor 404 may be a lighting detector or other type of sensor that measures lighting conditions of a scene for the camera 402. In some embodiments, the controller 405 may be implemented in hardware or in software. In some embodiments, the controller 405 may be implemented by one or more processors and memory of a mobile device (e.g., the mobile device 100 depicted in FIG. 1A). FIG. 4 illustrates that the controller 405 may receive feedback from a fluorescent detector 407 (which may correspond to the fluorescent detector 354 depicted in FIG. 3). The fluorescent detector 407 may provide feedback to the controller 405, including an indication of whether it is safe to turn on the laser diode(s) 420 or to provide an active shutoff to the controller 405 if UV light leakage is detected. This could be either feedback to the controller 405 (as depicted in FIG. 4) or like a "fuse" that is electrically connected in series to the laser diode(s) 420.

A light source module may comprise a single light source (e.g., a single laser-pumped phosphor light source, as described further herein) or may comprise any number of light sources (of the same light source type or different light source types). In the particular embodiment depicted in FIG. 4, the light source module 406 includes one or more laser light sources (e.g., a laser diode 420) and multiple LEDs (e.g., LEDs 402A-N). As described further herein, a laser-pumped phosphor light source 410 (or multiple laser-pumped phosphor light sources) includes the laser diode(s) 420 and photoluminescent phosphor(s) 424. The laser diode 420 is configured to generate laser light within a first wavelength range to pump the photoluminescent phosphor 424. Exposure of the photoluminescent phosphor 424 to the laser light results in emission of visible light within a second wavelength range according to a laser-pumped emission spectrum associated with the photoluminescent phosphor 424. To illustrate, referring to the laser-pumped phosphor light source 110 depicted in FIGS. 1B/1C, the laser diode 120 generates the laser light 122 to pump the photoluminescent phosphor 124, resulting in emission of the visible light 126. FIG. 3 illustrates that, in some embodiments, the laser light 122 generated by the laser diode 120 may include UV light to pump the photoluminescent phosphor 124, resulting in emission of the visible light 126. As described further herein, in some cases, utilizing UV light to pump the photoluminescent phosphor 124 may be advantageous to avoid speckle (interference patterns) associated with other types of laser-pumped phosphor light sources, such as automotive headlights that rely on efficient blue lasers operating at about 450 nm (in the visible spectrum).

In a particular embodiment, the light sources of the light source module 406 of FIG. 4 may be arranged to form an array, such as the array 200 depicted in FIG. 2A. In this case, the laser-pumped phosphor light source 410 may correspond to the laser-pumped phosphor light source 110, and the multiple LEDs 402A-N may correspond to the first LED 202A, the second LED 202B, the third LED 202C, and the fourth LED 202D. As shown in FIG. 2B, the addition of optics 204A-D to the LEDs 202A-D form the LED light sources 212A-D.

In the particular embodiment depicted in FIG. 4, the light source module 406 further includes one or more direction control elements 414. In a particular steering orientation, the direction control element(s) 414 may be configured to direct the laser light generated by the laser diode(s) 420 toward a particular region 425 of the photoluminescent phosphor 424 associated with a particular optical element of one or more optical elements 428 of the light source module 406. Additionally, the light source module 406 depicted in FIG. 4 further includes one or more mirrors 416 to enable steering of the laser light toward the particular region 425 of the photoluminescent phosphor 424 associated with the particular optical element of the one or more optical elements 428. It will be appreciated that the laser light may be steered using the one or more direction control elements 414, one or more actuators (not shown), the one or more mirrors 416, or a combination thereof (among other alternatives). As illustrated and described further herein, FIGS. 5A-5C depict an example of a combination of direction control element(s) 514 and mirror(s) 516 to enable redirection of the laser light 122 generated by the laser diode 120 toward different regions 520-524 of the photoluminescent phosphor 124 associated with different optical elements 128A-N.

The controller 405 may control individual light sources independent of other light sources of the light source module 406. To illustrate, in some cases, the controller 405 may instruct the laser diode 420 to illuminate but not instruct the LEDs 402A-N to illuminate (e.g., for a particular laser flash module design, such as "spot light design"). In other cases, the controller 405 may instruct the laser diode 420 to illuminate and also instruct one or more of the LEDs 402A-N to illuminate. For example, the LEDs 402A-N may be configured to generate LED light according to respective LED emission spectrums. Accordingly, the visible light emitted by the photoluminescent phosphor 424 and the LED light generated by the one or more illuminated LEDs may be utilized to generate tunable white or other colored light.

Example Laser Light Steering Design

Figure 5A:
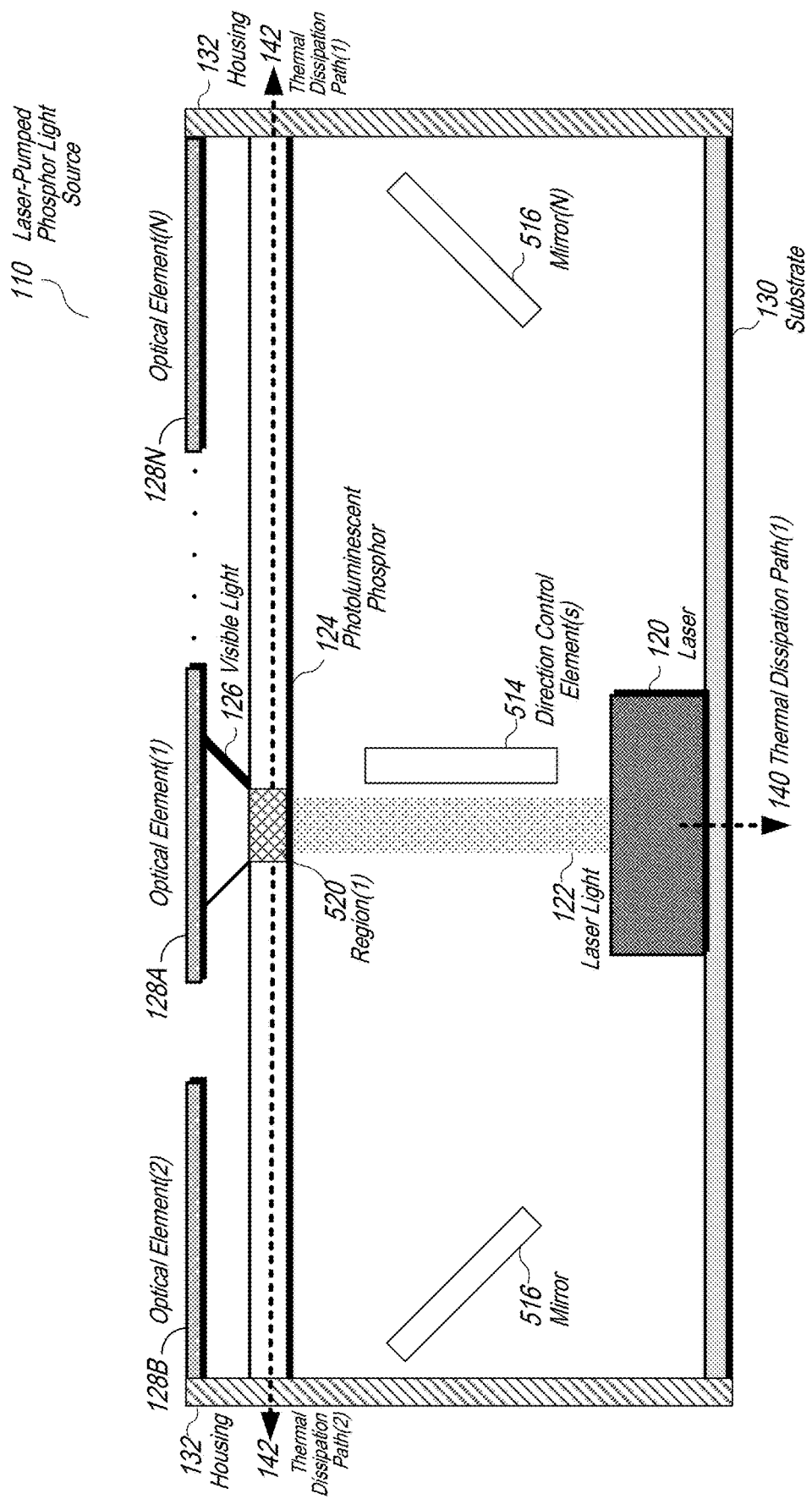
FIGS. 5A-C depict various cross-sectional views of a laser-pumped phosphor light source that includes a laser diode and a plurality of optical elements, in which laser light generated by the laser diode is steerable for pumping a particular region of a photoluminescent phosphor associated with a particular optical element of the plurality of optical elements, according to some embodiments.
Figure 5B:
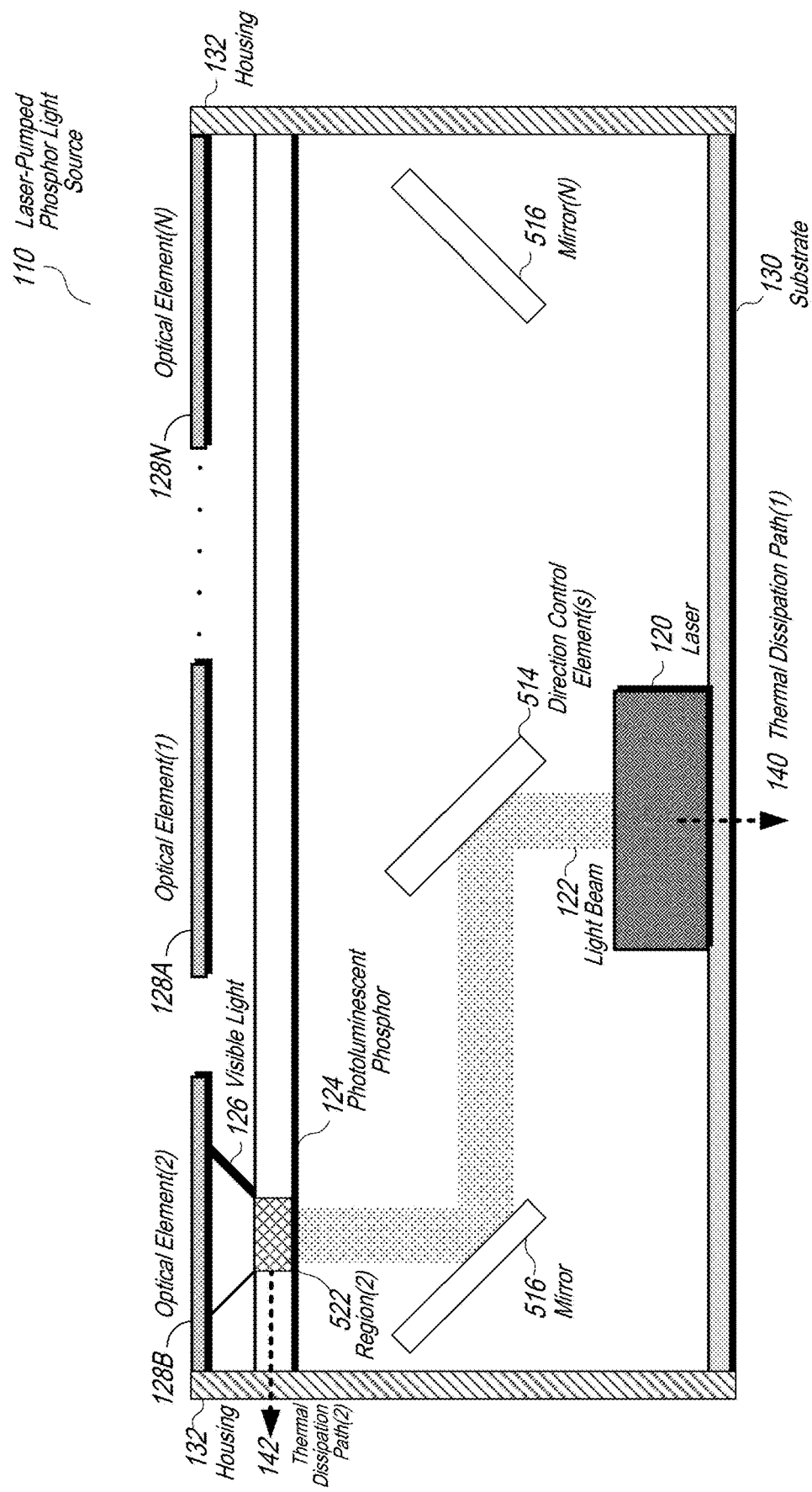
Figure 5C:
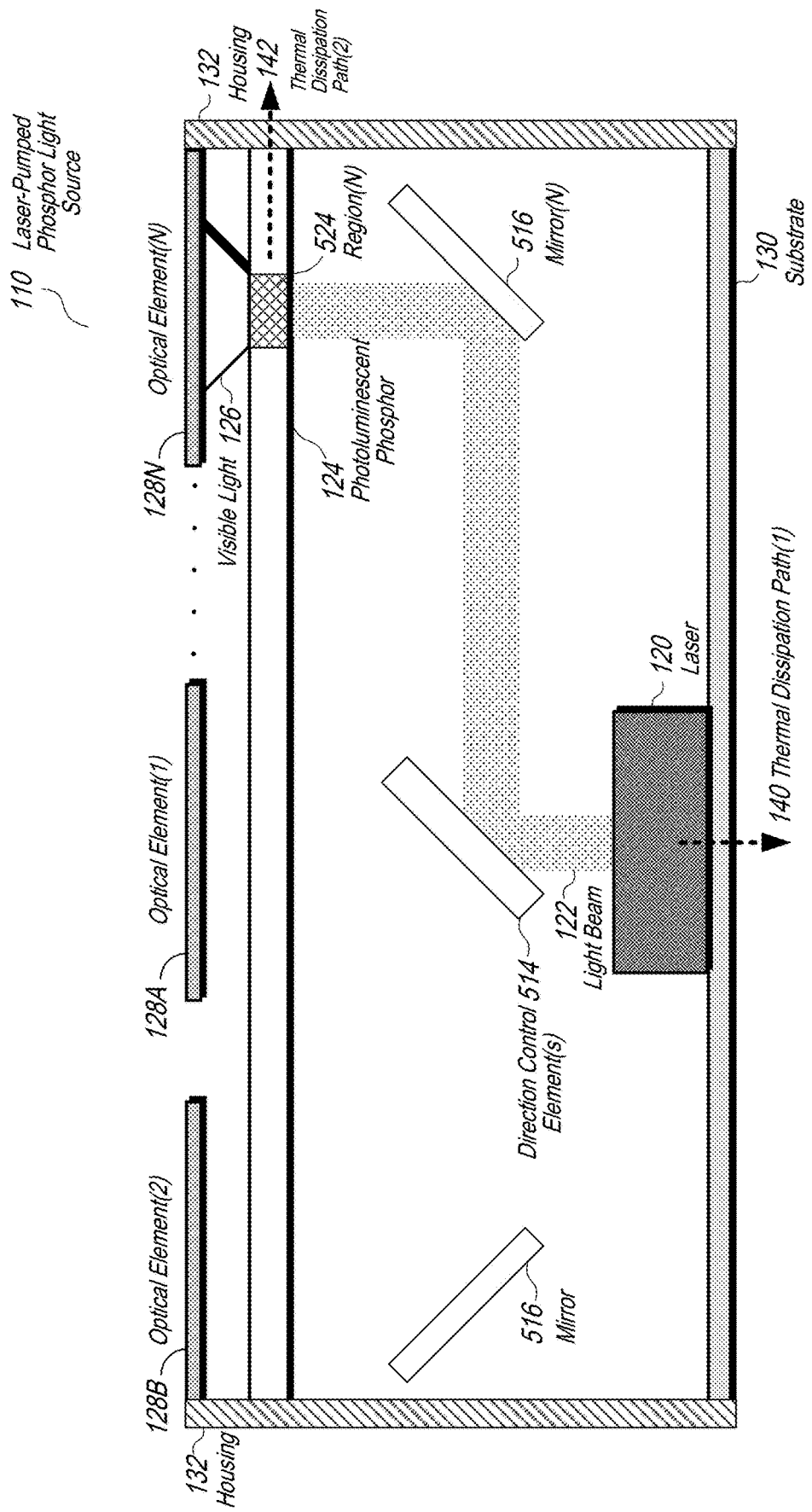

FIGS. 5A-5C depict cross-sectional views of a particular embodiment of the laser-pumped phosphor light source 110 that includes a plurality of optical elements 128A-N associated with the laser diode 120, according to some embodiments. In the embodiments depicted in FIGS. 5A-5C, in a particular steering orientation, one or more direction control elements 514 and one or more mirrors 516 may enable steering of the laser light 122 generated by the laser diode 120 for pumping a particular region of the photoluminescent phosphor 124 associated with a particular optical element of the plurality of optical elements 128A-N. In the example depicted in FIGS. 5A-5C, a first region 520 of the photoluminescent phosphor 124 is associated with a first optical element 128A, a second region 522 of the photoluminescent phosphor 124 is associated with a second optical element 128B, and an Nth region 524 of the photoluminescent phosphor 124 is associated with an Nth optical element 128N. In some cases, each of the regions 520-524 of the photoluminescent phosphor 124 may have the same phosphor characteristic. In other cases, different regions of the photoluminescent phosphor 124 may have different phosphor characteristics.

Referring to FIG. 5A, a first cross-sectional view of the laser-pumped phosphor light source 110 illustrates that the laser diode 120 and a first optical element 128A may be aligned such that the laser light 122 is directed to a first region 520 of the photoluminescent phosphor 124 associated with the first optical element 128A without steering of the laser light 122. In this case, the one or more direction control elements 514 are positioned in a non-steering orientation. The first region 520 of the photoluminescent phosphor 124 may have a particular phosphor characteristic.

The laser light 122 is within a first wavelength range to pump the photoluminescent phosphor 124 within the first region 520. Exposure of the photoluminescent phosphor 124 within the first region 520 to the laser light 122 results in emission of visible light 126 within a second wavelength range according to a laser-pumped emission spectrum associated with the photoluminescent phosphor 124. FIG. 5A illustrates that the visible light 126 is emitted toward the first optical element 128A for a laser associated with a particular design for a laser flash module. As illustrated and further described herein with respect to FIGS. 6-9, different optical elements may be associated with different designs for a laser flash module, such as: a wide field-of-view (FOV) design (see FIG. 6); a one-hundred-degree FOV design (see FIG. 7); a wide FOV visual field indicator (VFI) design (see FIG. 8); or a spot light design (see FIG. 9). In some cases, the first optical element 128A may correspond to one of the optical elements 602-902 depicted in FIGS. 6-9.

Referring to FIG. 5B, a second cross-sectional view of the laser-pumped phosphor light source 110 illustrates the direction control element(s) 514 in a first steering orientation. In the first steering orientation, the direction control element(s) 514 direct the laser light 122 toward a mirror 516 which is oriented to direct the laser light 122 toward a second region 522 of the photoluminescent phosphor 124 associated with a second optical element 128B of the plurality of optical elements 128A-N. In some cases, the second region 522 of the photoluminescent phosphor 124 may have a phosphor characteristic that is the same as the phosphor characteristic associated with the first region 520 of the photoluminescent phosphor 124. In other cases, the second region 522 may have a phosphor characteristic that is different from the phosphor characteristic associated with the first region 520.

The laser light 122 is within a first wavelength to pump the photoluminescent phosphor 124 within the second region 522. Exposure of the photoluminescent phosphor 124 within the first region 522 to the laser light 122 results in emission of visible light 126 within a second wavelength range according to a laser-pumped emission spectrum associated with the photoluminescent phosphor 124. FIG. 5B illustrates that the visible light 126 is emitted toward the second optical element 128B associated with a particular design for a laser flash module. As illustrated and further described herein with respect to FIGS. 6-9, different optical elements may be associated with different designs for a laser flash module, such as: a wide field-of-view (FOV) design (see FIG. 6); a one-hundred-degree FOV design (see FIG. 7); a wide FOV visual field indicator (VFI) design (see FIG. 8); or a spot light design (see FIG. 9). In some cases, the second optical element 128B may correspond to one of the optical elements 602-902 depicted in FIGS. 6-9.

Referring to FIG. 5C, a third cross-sectional view of the laser-pumped phosphor light source 110 illustrates the direction control element(s) 514 in a second steering orientation. In the second steering orientation, the direction control element(s) 514 direct the laser light 122 toward another mirror 516 (identified as "Mirror(N)" in FIG. 5C) which is oriented to direct the laser light 122 toward an Nth region 524 (identified as "Region(N)" in FIG. 5C) of the photoluminescent phosphor 124 associated with an Nth optical element 128N of the plurality of optical elements 128A-N. In some cases, the Nth region 524 of the photoluminescent phosphor 124 may have a phosphor characteristic that is the same as the phosphor characteristic associated with the first region 520 and the second region 522 of the photoluminescent phosphor 124. In other cases, the Nth region 524 may have a phosphor characteristic that is different from the phosphor characteristic associated with the first region 520 and/or the phosphor characteristic associated with the second region 522.

The laser light 122 is within a first wavelength range to pump the photoluminescent phosphor 124 within the Nth region 524. Exposure of the photoluminescent phosphor 124 within the Nth region 524 to the laser light 122 results in emission of visible light 126 within a second wavelength range according to a laser-pumped emission spectrum associated with the photoluminescent phosphor 124. FIG. 5C illustrates that the visible light 126 is emitted toward the Nth optical element 128N associated with a particular design for a laser flash module. As illustrated and further described herein with respect to FIGS. 6-9, different optical elements may be associated with different designs for a laser flash module, such as: a wide field-of-view (FOV) design (see FIG. 6); a one-hundred-degree FOV design (see FIG. 7); a wide FOV visual field indicator (VFI) design (see FIG. 8); or a spot light design (see FIG. 9). In some cases, the Nth optical element 128N may correspond to one of the optical elements 602-902 depicted in FIGS. 6-9.

Thus, FIGS. 5A to 5C illustrate a particular embodiment of a laser-pumped phosphor light source including a single laser diode and multiple optical elements. One or more directional control elements may enable beam steering of laser light emitted from the laser diode. In the particular embodiment depicted in FIG. 5A, no beam steering results in the beam of laser light being directed toward a first region of a photoluminescent phosphor associated with a first optical element. In FIG. 5A, the laser light pumps the photoluminescent phosphor in the first region, resulting in emission of visible light toward the first optical element. In the particular embodiments depicted in FIGS. 5B and 5C, the direction control element(s) are utilized for beam steering of the laser light. FIG. 5B depicts one example of beam steering, in which the beam of laser light is steered toward a particular mirror, which reflects the laser light toward a different region of the photoluminescent phosphor associated with a second optical element, resulting in emission of visible light toward the second optical element. FIG. 5C depicts another example of beam steering, in which a mirror is utilized to re-direct a steered beam of laser light toward a region of the photoluminescent phosphor associated with a second optical element, resulting in emission of visible light toward the second optical element.

Optics Design Examples

Figure 6:
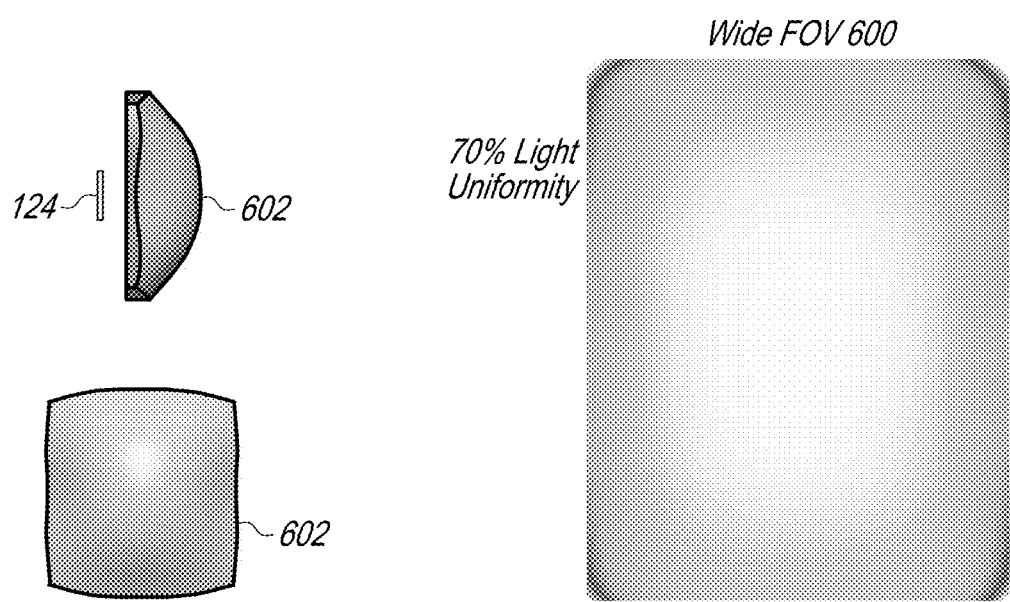
FIG. 6 illustrates an example of a first optical element associated with a first field-of-view (FOV) design for a laser flash module (referred to herein as a "wide FOV design"), according to some embodiments.
Figure 7:
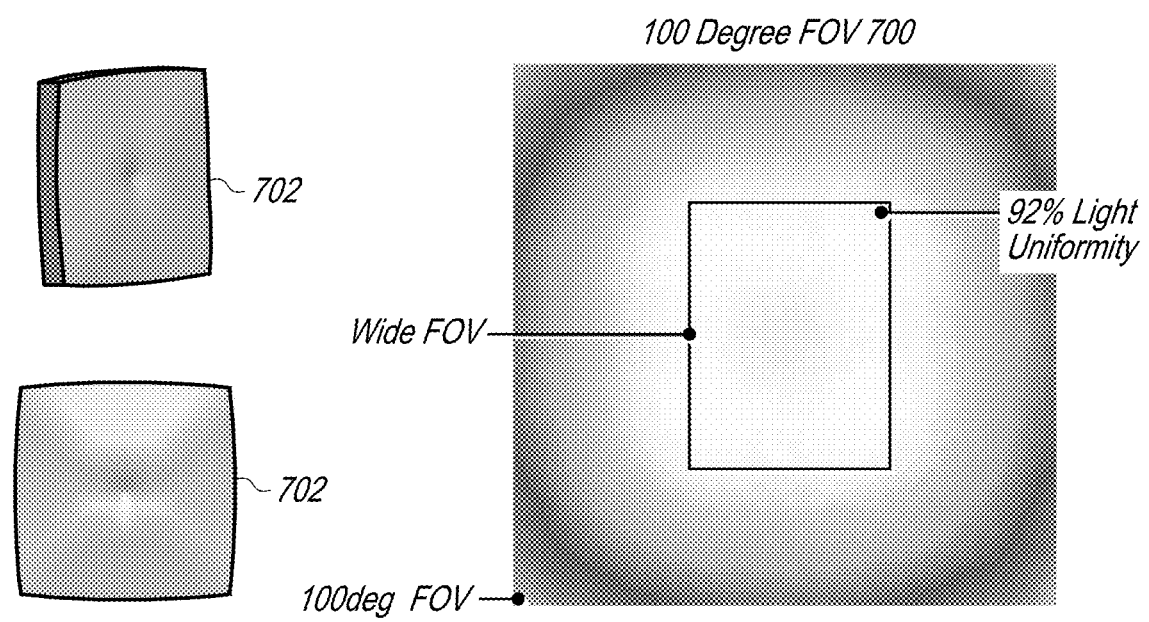
FIG. 7 illustrates an example of a second optical element associated with a second FOV design for a laser flash module (referred to herein as a "one-hundred-degree FOV design"), according to some embodiments.
Figure 8:
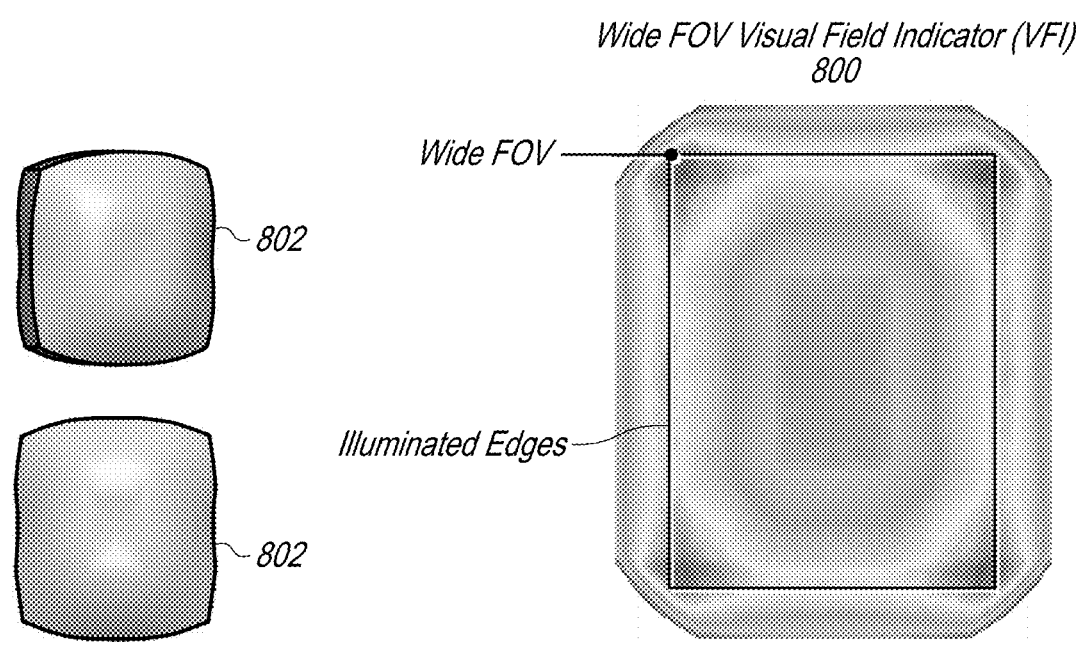
FIG. 8 illustrates an example of a third optical element associated with a FOV visual field indicator (VFI) design for a laser flash module (referred to herein as a "wide FOV VFI design") to enable illumination of edges of a corresponding FOV for a camera, according to some embodiments.
Figure 9:
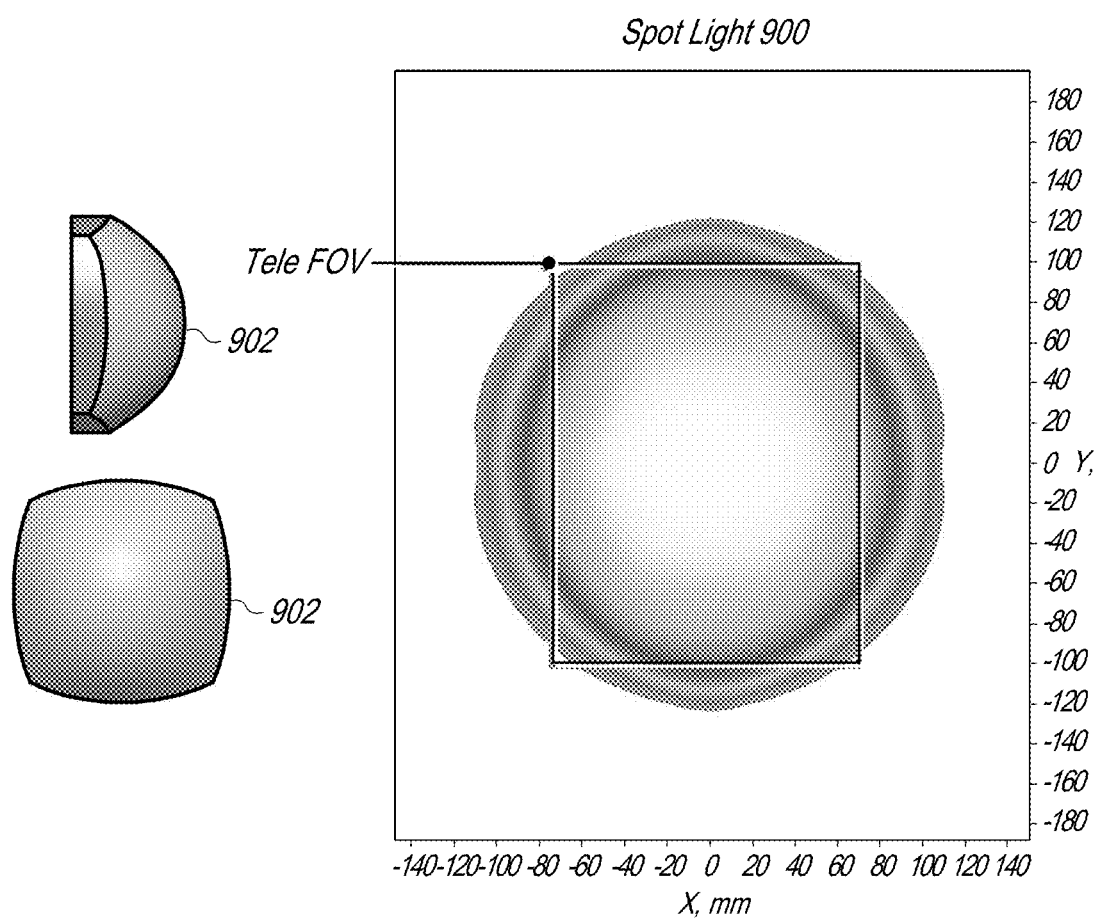
FIG. 9 illustrates an example of a fourth optical element associated with a spot light design for a laser flash module (referred to herein as a "spot light" design), according to some embodiments.

FIGS. 6-9 illustrate various optical elements that may be designed for a particular laser flash module design, such as a wide field-of-view (FOV) design (see FIG. 6); a one-hundred-degree FOV design (see FIG. 7); a wide FOV visual field indicator (VFI) design (see FIG. 8); or a laser flash module having a spot light design (see FIG. 9). FIGS. 6 and 7 indicate light intensity collected at some position relative to the center position of the emitted light area. Light uniformity is defined as how light intensity tends to spatially change across LED or laser emission area, such as how light intensity changes within a camera field of view (FOV). Certain regions of interest (ROI) may be selected within the camera FOV to quantify light emission uniformity which can then be expressed as a function of light intensities of particular regions of interest. In FIGS. 6 and 7, the region of interest (ROI) is near the edge of the flash module FOV. In FIG. 6, the intensity of light at this edge area of interest is 70% of the light intensity found at the center ROI of the FOV. Hence, the uniformity is 70% of that of the center. In FIG. 7, the intensity of light at this edge area of interest is 92% of the light intensity found at the center ROI of the FOV. Hence, the uniformity is 92% of that of the center.

FIG. 6 illustrates a first design example for an optic 602 for a laser flash module, referred to herein as a "Wide FOV" design 600. Highly uniform illuminance distribution supports a 75 degree diagonal camera FOV, where light uniformity=70%. Haze risk results from objects placed close to the flash module and reflecting light directly into the camera. Thick protective cases or user fingers may result in haze in the image. As such, an emission pattern that minimizes light at high angles is preferable. The design 600 depicted in FIG. 6 minimizes light emitted at very high angles of incidence and thus will have lower haze risk for camera. In a particular embodiment, the size of the optic 602 is about 2.6×2.7×1.2 mm. The view at the top left of FIG. 6 is a side view designed to illustrate that the optic 602 may be separated from the photoluminescent phosphor 124 by an air gap of about 200 according to one embodiment. In a particular embodiment, the source diameter for the photoluminescent phosphor 124 may be about 400 μm.

FIG. 7 illustrates a second design example for an optic 702 for a laser flash module, referred to herein as a "100° DFOV" design 700. Uniform illumination distribution supports a 100 degree diagonal camera FOV to support augmented reality (AR) applications, with a light uniformity=92%; a Wide FOV; and a 100° FOV. In a particular embodiment, the size of the optic 702 is about 5.6×5.6×0.7 mm. While not shown in FIG. 7, the optic 702 may be separated from the photoluminescent phosphor 124 (see the example depicted in FIG. 6) by an air gap of about 200 according to one embodiment. In a particular embodiment, the source diameter for the photoluminescent phosphor 124 may be about 400 μm.

FIG. 8 illustrates a third design example for an optic 802 for a laser flash module, referred to herein as a "Wide FOV Visual Field Indicator ("VFI")" design 800. In this design, the VFI may enable the user to identify the edge of the supported camera's FOV by illuminating the edges of the camera FOV (identified as "Illuminated Edges" in FIG. 8). In a particular embodiment, the size of the optic 802 is about 2.4×2.4×1.2 mm. While not shown in FIG. 8, the optic 802 may be separated from the photoluminescent phosphor 124 (see the example depicted in FIG. 6) by an air gap of about 200 according to one embodiment. In a particular embodiment, the source diameter for the photoluminescent phosphor 124 may be about 400 μm.

FIG. 9 illustrates a fourth design example for an optic 902 for a laser flash module, referred to herein as a "Spot Light" design 900. In this design, focused light may be utilized for a long-range flashlight (spotlight) or for high illuminance in portrait mode. A "portrait" mode may utilize a telephoto lens, which has a smaller field-of-view. As such, it is beneficial to focus the light emitted by the flash module into that smaller region (higher illuminance means longer range and/or shorter exposure time, which reduces motion blur). In a particular embodiment, the size of the optic 902 is about 1.5×1.5×0.8 mm. While not shown in FIG. 9, the optic 902 may be separated from the photoluminescent phosphor 124 (see the example depicted in FIG. 6) by an air gap of about 200 μm, according to one embodiment. In a particular embodiment, the source diameter for the photoluminescent phosphor 124 may be about 400 μm.

Another potential application of the system of the present disclosure would be to utilize the laser source for focal assistance, rather than as an illumination source. In low light situations, a white light illumination module utilizing a laser source can be used to illuminate a camera's field of view to provide focus assistance. It may illuminate a portion of the field of view or the entire field of view to provide the focus assistance. In this embodiment, the white light illumination module would be used to find an area of contrast in a scene, which could then be used for focusing.

Yet another potential application of the system of the present disclosure would be a visual field indicator. A visual field indicator generated by a laser source and associated optics would project a shape of light against a surface. This shape could be a square, circular, rectangular, or other shape. The visual field indicator would match the associated camera's field of view, which could inform a user where the camera field of view is without looking at a viewfinder. This would be beneficial in group photo situations to align subjects and the photographer within the field of view. It would also be beneficial to provide a focus target for the camera in situations of low light and contrast. A focus target could be a shape that would provide a high contrast surface to aid the camera in focusing. One example is shown in the third design example depicted in FIG. 8.

Example Method Performed by a Mobile Device

Figure 10:
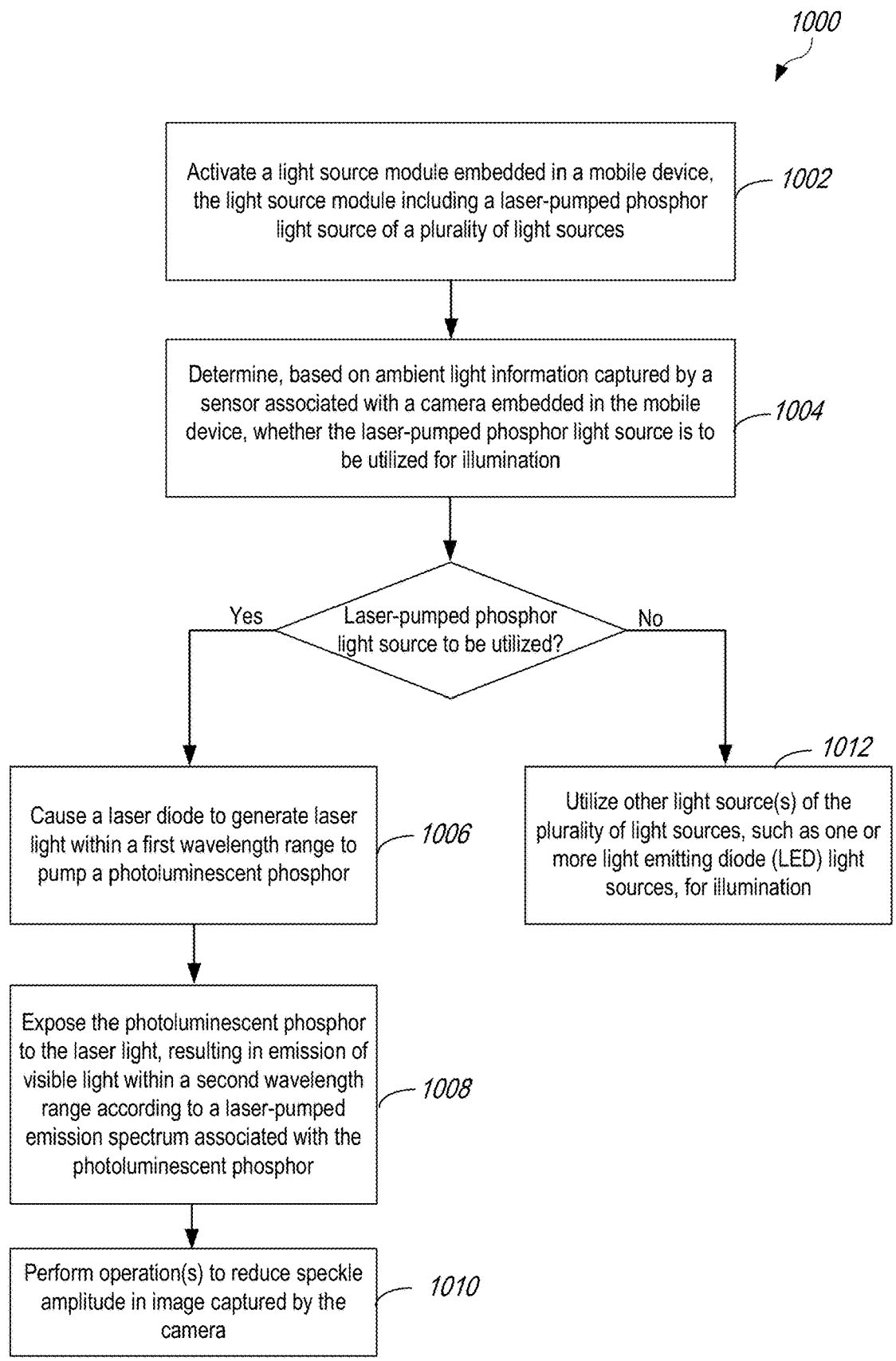
FIG. 10 is a flow diagram illustrating a method performed by a mobile device having a light source module that includes a laser-pumped phosphor light source of a plurality of light sources, according to some embodiments.

Referring to FIG. 10, a particular embodiment of a method performed by a mobile device is illustrated and generally designated 1000. In some cases, the mobile device may correspond to the mobile device 100 depicted in FIG. 1A.

At 1002, the method includes activating a light source module embedded in a mobile device. The light source module includes a laser-pumped phosphor light source of a plurality of light sources. For example, referring to FIG. 1A, mobile device 100 may activate the light source module 106 embedded in the mobile device 100, where the light source module 106 includes the laser-pumped phosphor light source 110. In the particular embodiment depicted in FIG. 1A, the light source module 106 includes additional light sources, including multiple LED light sources 112A-D. As illustrated in the examples of FIGS. 1B/1C, the laser-pumped light source 110 includes the photoluminescent phosphor 124 and the laser diode 120. The laser diode 120 is configured to generate laser light 122 within a first wavelength range to pump the photoluminescent phosphor 124. Exposure of the photoluminescent phosphor 124 to the laser light 122 results in emission of visible light 126 within a second wavelength range according to a laser-pumped emission spectrum associated with the photoluminescent phosphor 124.

At 1004, the method includes determining, based on ambient light information captured by a sensor associated with a camera embedded in the mobile device, whether the laser-pumped phosphor light source is to be utilized for illumination. For example, referring to FIG. 1A, the sensor 104 embedded in the mobile device 100 may be configured to capture ambient light information for the camera 102 embedded in the mobile device 100. A controller associated with the mobile device 100 of FIG. 1A (such as the controller 405 described herein with respect to FIG. 4) may be configured to determine whether the laser-pumped phosphor light source 110 is to be utilized for illumination based on the ambient light information.

Responsive to determining, at 1004, that the laser-pumped phosphor light source is to be utilized for illumination, the method includes causing a laser diode to generate laser light within a first wavelength range to pump a photoluminescent phosphor of the laser-pumped phosphor light source, at 1006. For example, a controller associated with the mobile device 100 of FIG. 1A (e.g., the controller 405 described herein with respect to FIG. 4) may cause the laser diode 120 to generate the laser light 122 to pump the photoluminescent phosphor 124, as illustrated in FIGS. 1B/1C. In some cases, as described further herein with respect to FIG. 3, the laser light 122 may correspond to UV light. In some cases, both the laser diode 120 and one or more other light sources (e.g., LED light sources) may be utilized for illumination.

At 1008, the method includes exposing the photoluminescent phosphor to the laser light, resulting in emission of visible light within a second wavelength range according to a laser-pumped emission spectrum associated with the photoluminescent phosphor. For example, referring to FIGS. 1B/1C, exposure of the photoluminescent phosphor 124 to the laser light 122 results in emission of the visible light 126 within a second wavelength range according to a laser-pumped emission spectrum associated with the photoluminescent phosphor 124. FIG. 10 illustrates a particular embodiment in which, when the laser-pumped phosphor light source is to be utilized for illumination, the method 1000 further includes performing one or more operations to reduce speckle amplitude in an image captured by the camera (e.g., when the laser light 122 is not UV light), at 1010. Direct monochromatic emission from the laser may cause speckle (interference patterns) to appear on illuminated surfaces. Because the speckle pattern results from interference of light travelling along different paths, motion can be used to average it out. To illustrate, the speckle reduction operations may include utilizing one or more actuators to re-position the camera image sensor, camera lens, or a combination thereof. Several frames could be captured at different actuator positions, then re-registered and combined, with the speckle amplitude reduced in the resulting image.

Responsive to determining, at 1004, that the laser-pumped phosphor light source is not to be utilized for illumination based on the ambient light information captured by the sensor, the method includes utilizing one or more other light sources of the plurality of light sources for illumination, at 1012. For example, a controller associated with the mobile device 100 of FIG. 1A (e.g., the controller 405 described herein with respect to FIG. 4) may select one or more of the LED light sources 112A-D of the light source module 106 of the mobile device 100 of FIG. 1A for illumination.

Multifunction Device Examples

Embodiments of electronic devices in which embodiments of light source modules, camera modules, etc. as described herein may be used, user interfaces for such devices, and associated processes for using such devices are described. As noted above, in some embodiments, light source modules, camera modules, etc. can be included in a mobile computing device which can include a camera device. In some embodiments, the device is a portable communications device, such as a mobile telephone, that also contains other functions, such as PDA and/or music player functions. Other portable electronic devices, such as laptops, cell phones, pad devices, or tablet computers with touch-sensitive surfaces (e.g., touch screen displays and/or touch pads), may also be used. It should also be understood that, in some embodiments, the device is not a portable communications device, but is a desktop computer with a touch-sensitive surface (e.g., a touch screen display and/or a touch pad). In some embodiments, the device is a gaming computer with orientation sensors (e.g., orientation sensors in a gaming controller). In other embodiments, the device is not a portable communications device, but is a camera device.

In the discussion that follows, an electronic device that includes a display and a touch-sensitive surface is described. It should be understood, however, that the electronic device may include one or more other physical user-interface devices, such as a physical keyboard, a mouse and/or a joystick.

The device typically supports a variety of applications, such as one or more of the following: a drawing application, a presentation application, a word processing application, a website creation application, a disk authoring application, a spreadsheet application, a gaming application, a telephone application, a video conferencing application, an e-mail application, an instant messaging application, a workout support application, a photo management application, a digital camera application, a digital video camera application, a web browsing application, a digital music player application, and/or a digital video player application.

The various applications that may be executed on the device may use one or more common physical user-interface devices, such as the touch-sensitive surface. One or more functions of the touch-sensitive surface as well as corresponding information displayed on the device may be adjusted and/or varied from one application to the next and/or within a respective application. In this way, a common physical architecture (such as the touch-sensitive surface) of the device may support the variety of applications with user interfaces that are intuitive and transparent to the user.

Attention is now directed toward embodiments of portable devices with cameras. FIG. 11B is a block diagram illustrating portable multifunction device 1100 with camera 1170 in accordance with some embodiments. The camera 1170, which is sometimes called an "optical sensor" for convenience, may also be known as or called an optical sensor system. FIG. 11B further illustrates sensor 1164 and embedded light source module 1175. In addition, multifunction device 1100 includes optical sensor 1164 illustrated in FIG. 11A on an opposite side of multifunction device 1100 from camera 1170.

Figure 11A:
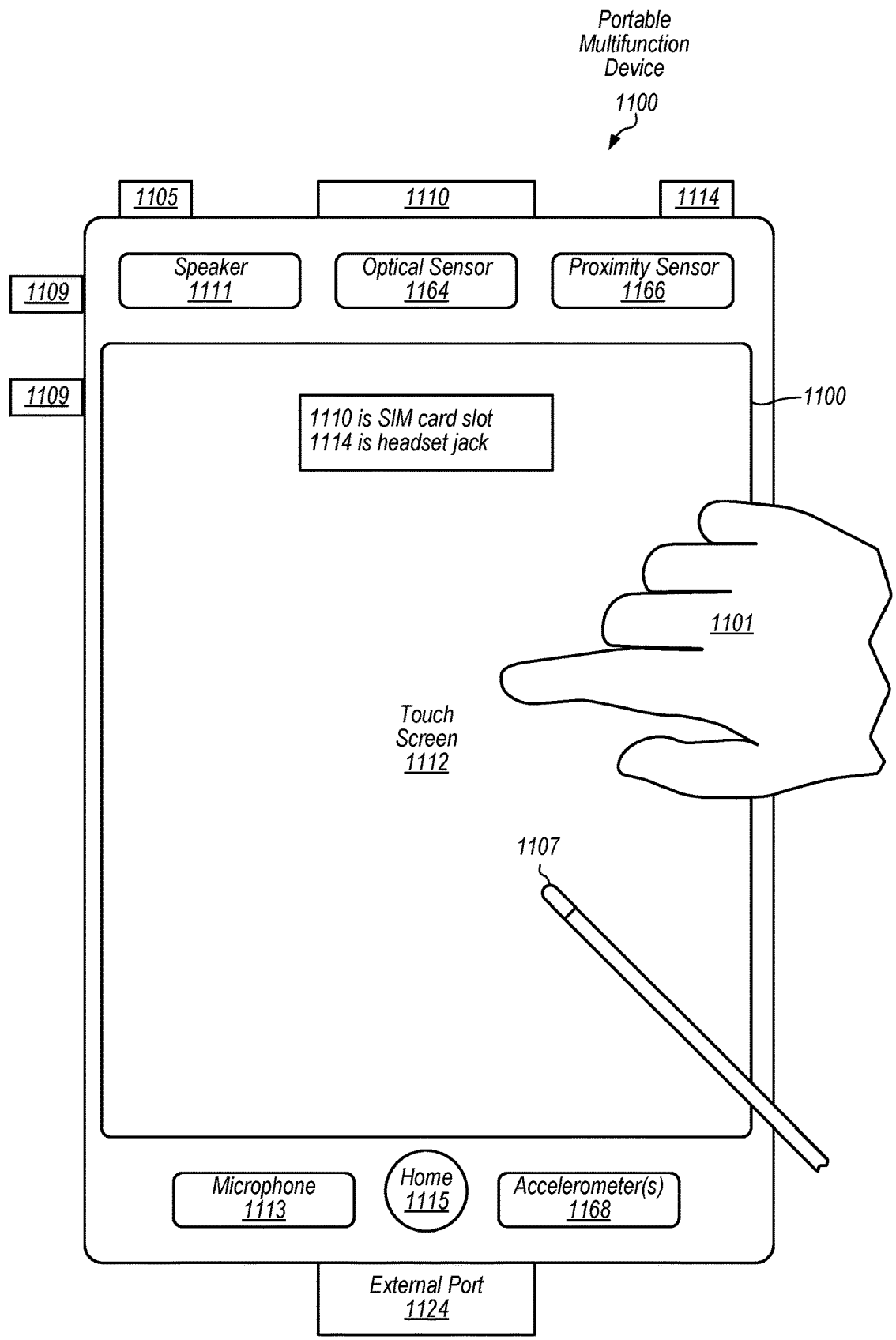
FIGS. 11A-11C illustrate a portable multifunction device with an embedded light source module that includes at least a laser-pumped phosphor light source, according to some embodiments.
Figure 11B:
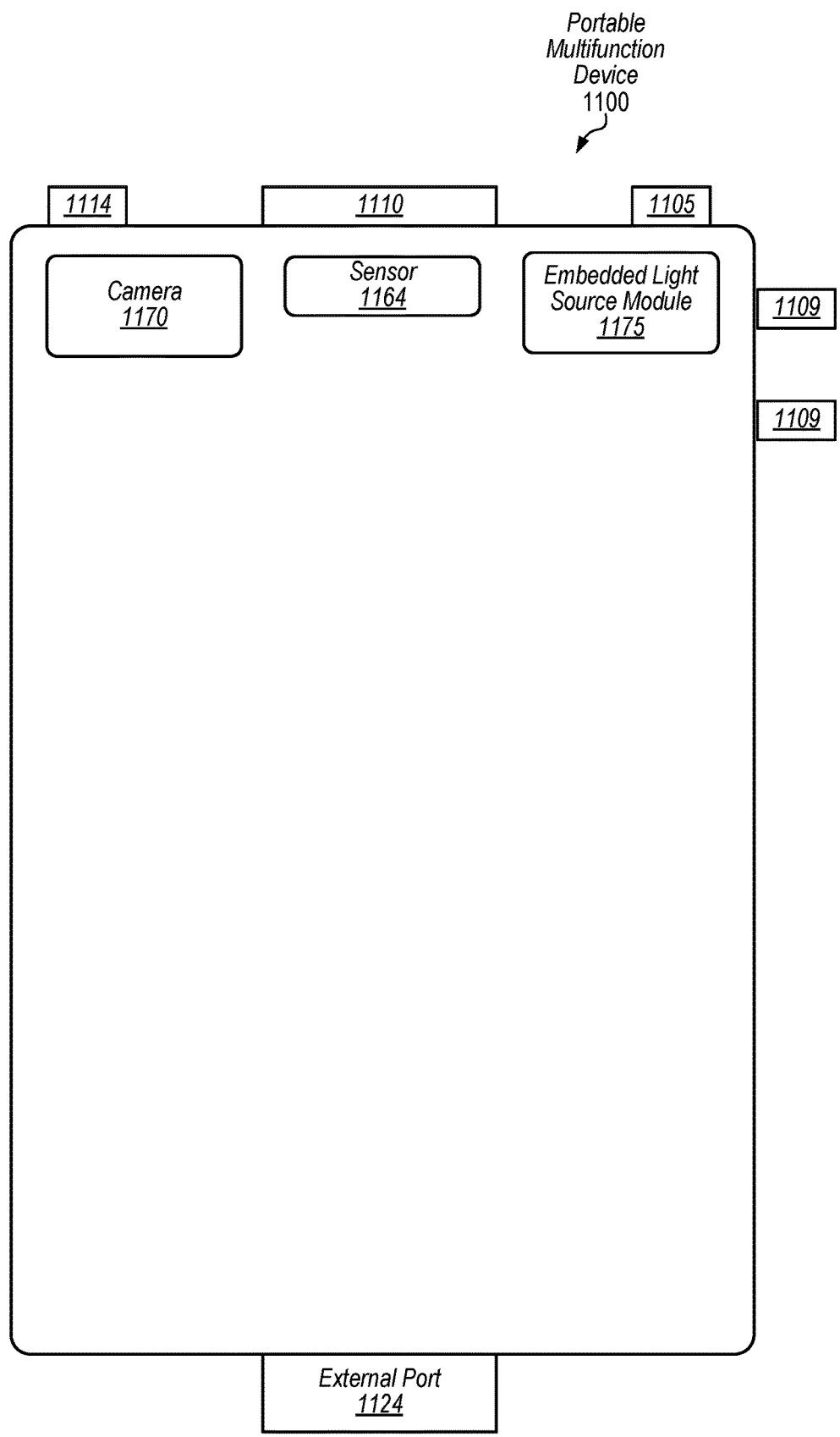
Figure 11C:
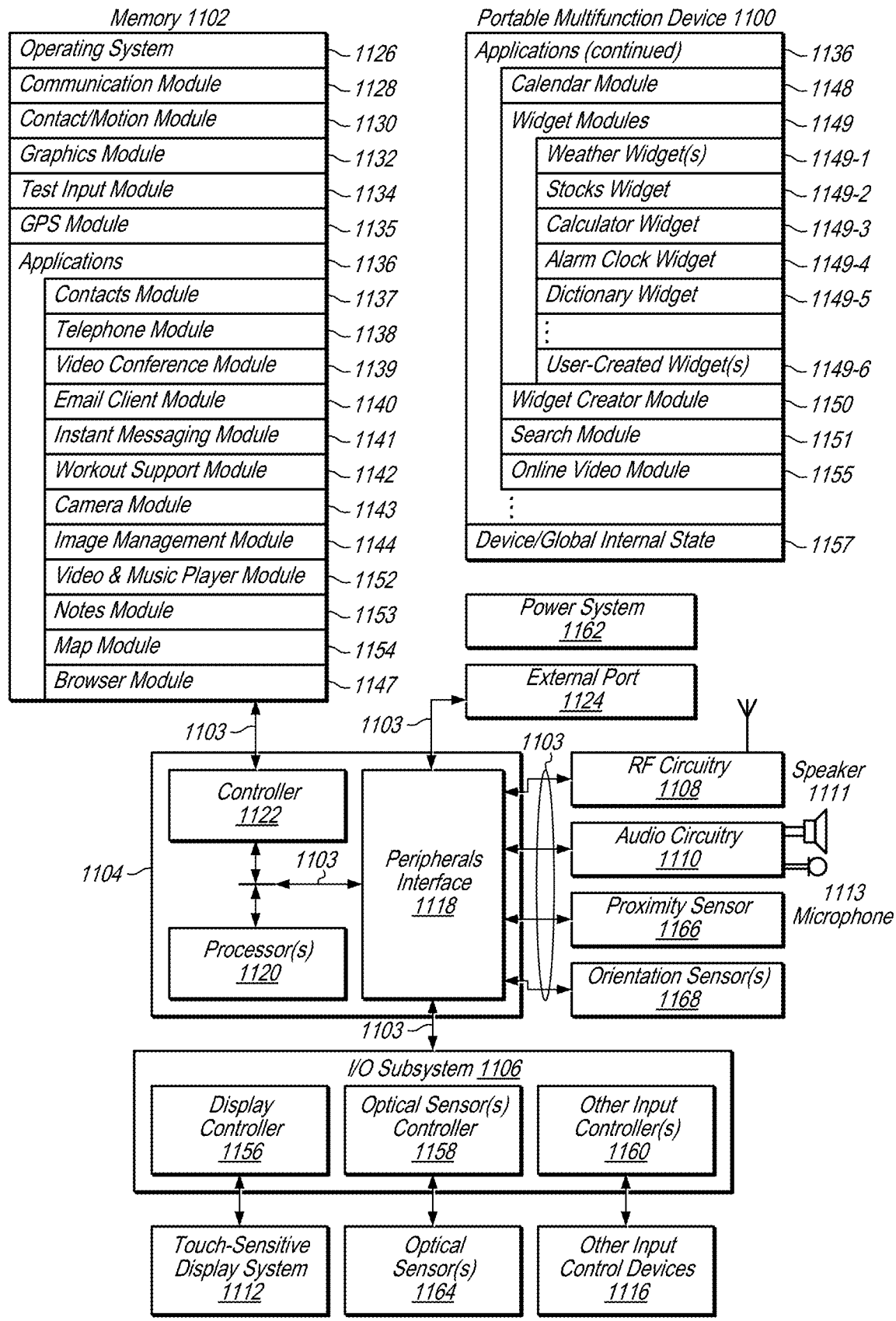

In some embodiments of the present disclosure, the device 1100 of FIGS. 11A-C may correspond to a mobile device that may be utilized to perform various methods described further herein, such as the mobile device 100 depicted in FIG. 1A. For example, the camera 1170 of the device 1100 depicted in FIG. 11B may correspond to the camera 102 of the mobile device 100 depicted in FIG. 1A. As another example, the camera sensor 1164 of the device 1100 depicted in FIG. 11B may correspond to the sensor 104 of the mobile device 100 depicted in FIG. 1A. As yet another example, the embedded light source module 1175 of the device 1100 depicted in FIG. 11B may correspond to the light source module 106 depicted in FIG. 1A.

With reference to FIG. 11B, the device 1100 may perform various methods described herein, including but not limited to the method depicted in the flow chart 1000 of FIG. 10. In this example method, the device 1100 may activate the embedded light source module 1175. As previously described herein, the embedded light source module 1175 includes at least a laser-pumped phosphor light source, such as the laser-pumped phosphor light source 110. As further illustrated in the examples of FIGS. 1B/1C, the laser-pumped phosphor light source 110 includes the photoluminescent phosphor 124 and the laser diode 120 to generate the laser light 122 (which may include UV light, as described further herein with respect to FIG. 3). The laser light 122 includes a first wavelength range to pump the photoluminescent phosphor 124. Exposure of the photoluminescent phosphor 124 to the laser light results in emission of the visible light 126 according to a laser-pumped emission spectrum associated with the photoluminescent phosphor 124. The embedded light source module 1175 may include one or more additional light sources, such as the multiple LED light sources 112A-D depicted in FIG. 1A. The LED light sources 112A-D are configured to generate LED light according to respective LED emission spectrums. In some cases, the device 1100 may utilize the visible light 126 emitted according to the laser-pumped emission spectrum and the LED light generated according to the respective LED emission spectrums to generate tunable white or other colored light.

With reference to the method described with respect to FIG. 10, the device 1100 may determine, based on ambient light information captured by the sensor 1164 associated with the camera 1170, whether the laser-pumped phosphor light source of the embedded light source module 1175 is to be utilized for illumination. In some cases, the ambient light information may indicate that the laser-pumped phosphor light source is to be utilized for illumination. In other cases, the ambient light information may indicate that one or more other light sources, such as one or more LEDs, are to be utilized for illumination. When the laser-pumped phosphor light source is to be utilized for illumination, the device 1100 may cause the laser diode 120 to generate the laser light 122 to pump the photoluminescent phosphor 124. Pumping the photoluminescent phosphor 124 results in emission of the visible light 126.

Referring to FIG. 11C, device 1100 may include memory 1102 (which may include one or more computer readable storage mediums), memory controller 172, one or more processing units (CPU's) 1120, peripherals interface 1118, RF circuitry 1108, audio circuitry 1110, speaker 1111, touch-sensitive display system 1112, microphone 1113, input/output (I/O) subsystem 1106, other input or control devices 1116, and external port 1124. Device 1100 may include one or more optical sensors 1164. These components may communicate over one or more communication buses or signal lines 1103.

It should be appreciated that device 1100 is only one example of a portable multifunction device, and that device 1100 may have more or fewer components than shown, may combine two or more components, or may have a different configuration or arrangement of the components. The various components shown in FIG. 11C may be implemented in hardware, software, or a combination of hardware and software, including one or more signal processing and/or application specific integrated circuits.

Memory 1102 may include high-speed random access memory and may also include non-volatile memory, such as one or more magnetic disk storage devices, flash memory devices, or other non-volatile solid-state memory devices. Access to memory 1102 by other components of device 1100, such as CPU 1120 and the peripherals interface 1118, may be controlled by memory controller 1122.

Peripherals interface 1118 can be used to couple input and output peripherals of the device to CPU 1120 and memory 1102. The one or more processors 1120 run or execute various software programs and/or sets of instructions stored in memory 1102 to perform various functions for device 1100 and to process data.

In some embodiments, peripherals interface 1118, CPU 1120, and memory controller 1122 may be implemented on a single chip, such as chip 1104. In some other embodiments, they may be implemented on separate chips.

RF (radio frequency) circuitry 1108 receives and sends RF signals, also called electromagnetic signals. RF circuitry 1108 converts electrical signals to/from electromagnetic signals and communicates with communications networks and other communications devices via the electromagnetic signals. RF circuitry 1108 may include well-known circuitry for performing these functions, including but not limited to an antenna system, an RF transceiver, one or more amplifiers, a tuner, one or more oscillators, a digital signal processor, a CODEC chipset, a subscriber identity module (SIM) card, memory, and so forth. RF circuitry 1108 may communicate with networks, such as the Internet, also referred to as the World Wide Web (WWW), an intranet and/or a wireless network, such as a cellular telephone network, a wireless local area network (LAN) and/or a metropolitan area network (MAN), and other devices by wireless communication. The wireless communication may use any of a variety of communications standards, protocols and technologies, including but not limited to Global System for Mobile Communications (GSM), Enhanced Data GSM Environment (EDGE), high-speed downlink packet access (HSDPA), high-speed uplink packet access (HSUPA), wideband code division multiple access (W-CDMA), code division multiple access (CDMA), time division multiple access (TDMA), Bluetooth, Wireless Fidelity (Wi-Fi) (e.g., IEEE 802.11a, IEEE 802.11b, IEEE 802.11g and/or IEEE 802.11n), voice over Internet Protocol (VoIP), Wi-MAX, a protocol for e-mail (e.g., Internet message access protocol (IMAP) and/or post office protocol (POP)), instant messaging (e.g., extensible messaging and presence protocol (XMPP), Session Initiation Protocol for Instant Messaging and Presence Leveraging Extensions (SIMPLE), Instant Messaging and Presence Service (IMPS)), and/or Short Message Service (SMS), or any other suitable communication protocol, including communication protocols not yet developed as of the filing date of this document.

Audio circuitry 1110, speaker 1111, and microphone 1113 provide an audio interface between a user and device 1100. Audio circuitry 1110 receives audio data from peripherals interface 1118, converts the audio data to an electrical signal, and transmits the electrical signal to speaker 1111. Speaker 1111 converts the electrical signal to human-audible sound waves. Audio circuitry 1110 also receives electrical signals converted by microphone 1113 from sound waves. Audio circuitry 1110 converts the electrical signal to audio data and transmits the audio data to peripherals interface 1118 for processing. Audio data may be retrieved from and/or transmitted to memory 1102 and/or RF circuitry 1108 by peripherals interface 1118. In some embodiments, audio circuitry 1110 also includes a headset jack (e.g., 1114, FIG. 11A-B). The headset jack 1114 provides an interface between audio circuitry 1110 and removable audio input/output peripherals, such as output-only headphones or a headset with both output (e.g., a headphone for one or both ears) and input (e.g., a microphone).

I/O subsystem 1106 couples input/output peripherals on device 1100, such as touch screen 1112 and other input control devices 1116, to peripherals interface 1118. I/O subsystem 1106 may include display controller 1156 and one or more input controllers 1160 for other input or control devices. The one or more input controllers 1116 receive/send electrical signals from/to other input or control devices 1116. The other input control devices 1116 may include physical buttons (e.g., push buttons, rocker buttons, etc.), dials, slider switches, joysticks, click wheels, and so forth. In some alternative embodiments, input controller(s) 1160 may be coupled to any (or none) of the following: a keyboard, infrared port, USB port, and a pointer device such as a mouse. The one or more buttons (e.g., 1108, FIG. 11A-B) may include an up/down button for volume control of speaker 1111 and/or microphone 1113. The one or more buttons may include a push button (e.g., 1105, FIG. 11A-B).

Touch-sensitive display 1112 provides an input interface and an output interface between the device and a user. Display controller 1156 receives and/or sends electrical signals from/to touch screen 1112. Touch screen 1112 displays visual output to the user. The visual output may include graphics, text, icons, video, and any combination thereof (collectively termed "graphics"). In some embodiments, some or all of the visual output may correspond to user-interface objects.

Touch screen 1112 has a touch-sensitive surface, sensor or set of sensors that accepts input from the user based on haptic and/or tactile contact. Touch screen 1112 and display controller 1156 (along with any associated modules and/or sets of instructions in memory 1102) detect contact (and any movement or breaking of the contact) on touch screen 1112 and converts the detected contact into interaction with user-interface objects (e.g., one or more soft keys, icons, web pages or images) that are displayed on touch screen 1112. In an example embodiment, a point of contact between touch screen 1112 and the user corresponds to a finger of the user.

Touch screen 1112 may use LCD (liquid crystal display) technology, LPD (light emitting polymer display) technology, or LED (light emitting diode) technology, although other display technologies may be used in other embodiments. Touch screen 1112 and display controller 1156 may detect contact and any movement or breaking thereof using any of a variety of touch sensing technologies now known or later developed, including but not limited to capacitive, resistive, infrared, and surface acoustic wave technologies, as well as other proximity sensor arrays or other elements for determining one or more points of contact with touch screen 1112. In an example embodiment, projected mutual capacitance sensing technology may be used.

Touch screen 1112 may have a video resolution in excess of 100 dots per inch (dpi). In some embodiments, the touch screen has a video resolution of approximately 160 dpi. The user may make contact with touch screen 1112 using any suitable object or appendage, such as a stylus, a finger, and so forth. In some embodiments, the user interface is designed to work primarily with finger-based contacts and gestures, which can be less precise than stylus-based input due to the larger area of contact of a finger on the touch screen. In some embodiments, the device translates the rough finger-based input into a precise pointer/cursor position or command for performing the actions desired by the user.

In some embodiments, in addition to the touch screen, device 1100 may include a touchpad (not shown) for activating or deactivating particular functions. In some embodiments, the touchpad is a touch-sensitive area of the device that, unlike the touch screen, does not display visual output. The touchpad may be a touch-sensitive surface that is separate from touch screen 1112 or an extension of the touch-sensitive surface formed by the touch screen.

Device 1100 also includes power system 1162 for powering the various components. Power system 1162 may include a power management system, one or more power sources (e.g., battery, alternating current (AC)), a recharging system, a power failure detection circuit, a power converter or inverter, a power status indicator (e.g., a light-emitting diode (LED)) and any other components associated with the generation, management and distribution of power in portable devices.

Device 1100 may also include one or more optical sensors or cameras 1164. FIG. 11C shows an optical sensor coupled to optical sensor controller 1158 in I/O subsystem 1106. Optical sensor 1164 may include charge-coupled device (CCD) or complementary metal-oxide semiconductor (CMOS) phototransistors. Optical sensor 1164 receives light from the environment, projected through one or more lens, and converts the light to data representing an image. In conjunction with imaging module 1143 (also called a camera module), optical sensor 1164 may capture still images or video. In some embodiments, an optical sensor is located on the back of device 1100, opposite touch screen display 1112 on the front of the device, so that the touch screen display may be used as a viewfinder for still and/or video image acquisition. In some embodiments, another optical sensor is located on the front of the device so that the user's image may be obtained for videoconferencing while the user views the other videoconference participants on the touch screen display.

Device 1100 may also include one or more proximity sensors 1166. FIG. 11C shows proximity sensor 1166 coupled to peripherals interface 1118. Alternatively, proximity sensor 1166 may be coupled to input controller 1160 in I/O subsystem 1106. In some embodiments, the proximity sensor turns off and disables touch screen 1112 when the multifunction device is placed near the user's ear (e.g., when the user is making a phone call).

Device 1100 includes one or more orientation sensors 1168. In some embodiments, the one or more orientation sensors include one or more accelerometers (e.g., one or more linear accelerometers and/or one or more rotational accelerometers). In some embodiments, the one or more orientation sensors include one or more gyroscopes. In some embodiments, the one or more orientation sensors include one or more magnetometers. In some embodiments, the one or more orientation sensors include one or more of global positioning system (GPS), Global Navigation Satellite System (GLONASS), and/or other global navigation system receivers. The GPS, GLONASS, and/or other global navigation system receivers may be used for obtaining information concerning the location and orientation (e.g., portrait or landscape) of device 1100. In some embodiments, the one or more orientation sensors include any combination of orientation/rotation sensors. FIG. 11C shows the one or more orientation sensors 1168 coupled to peripherals interface 1118. Alternatively, the one or more orientation sensors 1168 may be coupled to an input controller 1160 in I/O subsystem 1106. In some embodiments, information is displayed on the touch screen display in a portrait view or a landscape view based on an analysis of data received from the one or more orientation sensors.

In some embodiments, the software components stored in memory 1102 include operating system 1126, communication module (or set of instructions) 1128, contact/motion module (or set of instructions) 1130, graphics module (or set of instructions) 1132, text input module (or set of instructions) 1134, Global Positioning System (GPS) module (or set of instructions) 1135, and applications (or sets of instructions) 1136. Furthermore, in some embodiments memory 1102 stores device/global internal state 1157. Device/global internal state 1157 includes one or more of: active application state, indicating which applications, if any, are currently active; display state, indicating what applications, views or other information occupy various regions of touch screen display 1112; sensor state, including information obtained from the device's various sensors and input control devices 1116; and location information concerning the device's location and/or attitude.

Operating system 1126 (e.g., Darwin, RTXC, LINUX, UNIX, OS X, WINDOWS, or an embedded operating system such as VxWorks) includes various software components and/or drivers for controlling and managing general system tasks (e.g., memory management, storage device control, power management, etc.) and facilitates communication between various hardware and software components.

Communication module 1128 facilitates communication with other devices over one or more external ports 1124 and also includes various software components for handling data received by RF circuitry 1108 and/or external port 1124. External port 1124 (e.g., Universal Serial Bus (USB), FIREWIRE, etc.) is adapted for coupling directly to other devices or indirectly over a network (e.g., the Internet, wireless LAN, etc.).

Contact/motion module 1130 may detect contact with touch screen 1112 (in conjunction with display controller 1156) and other touch sensitive devices (e.g., a touchpad or physical click wheel). Contact/motion module 1130 includes various software components for performing various operations related to detection of contact, such as determining if contact has occurred (e.g., detecting a finger-down event), determining if there is movement of the contact and tracking the movement across the touch-sensitive surface (e.g., detecting one or more finger-dragging events), and determining if the contact has ceased (e.g., detecting a finger-up event or a break in contact). Contact/motion module 1130 receives contact data from the touch-sensitive surface. Determining movement of the point of contact, which is represented by a series of contact data, may include determining speed (magnitude), velocity (magnitude and direction), and/or an acceleration (a change in magnitude and/or direction) of the point of contact. These operations may be applied to single contacts (e.g., one finger contacts) or to multiple simultaneous contacts (e.g., "multitouch"/multiple finger contacts). In some embodiments, contact/motion module 1130 and display controller 1156 detect contact on a touchpad.

Contact/motion module 1130 may detect a gesture input by a user. Different gestures on the touch-sensitive surface have different contact patterns. Thus, a gesture may be detected by detecting a particular contact pattern. For example, detecting a finger tap gesture includes detecting a finger-down event followed by detecting a finger-up (lift off) event at the same position (or substantially the same position) as the finger-down event (e.g., at the position of an icon). As another example, detecting a finger swipe gesture on the touch-sensitive surface includes detecting a finger-down event followed by detecting one or more finger-dragging events, and subsequently followed by detecting a finger-up (lift off) event.

Graphics module 1132 includes various known software components for rendering and displaying graphics on touch screen 1112 or other display, including components for changing the intensity of graphics that are displayed. As used herein, the term "graphics" includes any object that can be displayed to a user, including without limitation text, web pages, icons (such as user-interface objects including soft keys), digital images, videos, animations and the like.

In some embodiments, graphics module 1132 stores data representing graphics to be used. Each graphic may be assigned a corresponding code. Graphics module 1132 receives, from applications etc., one or more codes specifying graphics to be displayed along with, if necessary, coordinate data and other graphic property data, and then generates screen image data to output to display controller 1156.

Text input module 1134, which may be a component of graphics module 1132, provides soft keyboards for entering text in various applications (e.g., contacts 1137, e-mail 1140, IM 1141, browser 1147, and any other application that needs text input).

GPS module 1135 determines the location of the device and provides this information for use in various applications (e.g., to telephone 1138 for use in location-based dialing, to camera module 1143 as picture/video metadata, and to applications that provide location-based services such as weather widgets, local yellow page widgets, and map/navigation widgets).

Applications 1136 may include the following modules (or sets of instructions), or a subset or superset thereof:
- contacts module 1137 (sometimes called an address book or contact list);
- telephone module 1138;
- video conferencing module 1139;
- e-mail client module 1140;
- instant messaging (IM) module 1141;
- workout support module 1142;
- camera module 1143 for still and/or video images;
- image management module 1144;
- browser module 1147;
- calendar module 1148;
- widget modules 1149, which may include one or more of: weather widget 1149-1, stocks widget 1149-2, calculator widget 1149-3, alarm clock widget 1149-4, dictionary widget 1149-5, and other widgets obtained by the user, as well as user-created widgets 1149-6;

widget creator module 1150 for making user-created widgets 1149-6;

search module 1151;

video and music player module 1152, which may be made up of a video player module and a music player module;

notes module 1153;

map module 1154; and/or online video module 1155.

Examples of other applications 1136 that may be stored in memory 1102 include other word processing applications, other image editing applications, drawing applications, presentation applications, JAVA-enabled applications, encryption, digital rights management, voice recognition, and voice replication.

In conjunction with touch screen 1112, display controller 1156, contact module 1130, graphics module 1132, and text input module 1134, contacts module 1137 may be used to manage an address book or contact list (e.g., stored in application internal state 1192 of contacts module 1137 in memory 1102), including: adding name(s) to the address book; deleting name(s) from the address book; associating telephone number(s), e-mail address(es), physical address(es) or other information with a name; associating an image with a name; categorizing and sorting names; providing telephone numbers or e-mail addresses to initiate and/or facilitate communications by telephone 1138, video conference 1139, e-mail 1140, or IM 1141; and so forth.

In conjunction with RF circuitry 1108, audio circuitry 1110, speaker 1111, microphone 1113, touch screen 1112, display controller 1156, contact module 1130, graphics module 1132, and text input module 1134, telephone module 1138 may be used to enter a sequence of characters corresponding to a telephone number, access one or more telephone numbers in address book 1137, modify a telephone number that has been entered, dial a respective telephone number, conduct a conversation and disconnect or hang up when the conversation is completed. As noted above, the wireless communication may use any of a variety of communications standards, protocols and technologies.

In conjunction with RF circuitry 1108, audio circuitry 1110, speaker 1111, microphone 1113, touch screen 1112, display controller 1156, optical sensor 1164, optical sensor controller 1158, contact module 1130, graphics module 1132, text input module 1134, contact list 1137, and telephone module 1138, videoconferencing module 1139 includes executable instructions to initiate, conduct, and terminate a video conference between a user and one or more other participants in accordance with user instructions.

In conjunction with RF circuitry 1108, touch screen 1112, display controller 1156, contact module 1130, graphics module 1132, and text input module 1134, e-mail client module 1140 includes executable instructions to create, send, receive, and manage e-mail in response to user instructions. In conjunction with image management module 1144, e-mail client module 1140 makes it very easy to create and send e-mails with still or video images taken with camera module 1143.

In conjunction with RF circuitry 1108, touch screen 1112, display controller 1156, contact module 1130, graphics module 1132, and text input module 1134, the instant messaging module 1141 includes executable instructions to enter a sequence of characters corresponding to an instant message, to modify previously entered characters, to transmit a respective instant message (for example, using a Short Message Service (SMS) or Multimedia Message Service (MMS) protocol for telephony-based instant messages or using XMPP, SIMPLE, or IMPS for Internet-based instant messages), to receive instant messages and to view received instant messages. In some embodiments, transmitted and/or received instant messages may include graphics, photos, audio files, video files and/or other attachments as are supported in a MMS and/or an Enhanced Messaging Service (EMS). As used herein, "instant messaging" refers to both telephony-based messages (e.g., messages sent using SMS or MMS) and Internet-based messages (e.g., messages sent using XMPP, SIMPLE, or IMPS).

In conjunction with RF circuitry 1108, touch screen 1112, display controller 1156, contact module 1130, graphics module 1132, text input module 1134, GPS module 1135, map module 1154, and music player module 1146, workout support module 1142 includes executable instructions to create workouts (e.g., with time, distance, and/or calorie burning goals); communicate with workout sensors (sports devices); receive workout sensor data; calibrate sensors used to monitor a workout; select and play music for a workout; and display, store and transmit workout data.

In conjunction with touch screen 1112, display controller 1156, optical sensor(s) 1164, optical sensor controller 1158, embedded light source module 1175, sensor 1176, contact module 1130, graphics module 1132, and image management module 1144, camera module 1143 includes executable instructions to capture still images or video (including a video stream) and store them into memory 1102, modify characteristics of a still image or video, or delete a still image or video from memory 1102.

In conjunction with touch screen 1112, display controller 1156, contact module 1130, graphics module 1132, text input module 1134, embedded light source module 1175, sensor 1176, and camera module 1143, image management module 1144 includes executable instructions to arrange, modify (e.g., edit), or otherwise manipulate, label, delete, present (e.g., in a digital slide show or album), and store still and/or video images.

In conjunction with RF circuitry 1108, touch screen 1112, display system controller 1156, contact module 1130, graphics module 1132, and text input module 1134, browser module 1147 includes executable instructions to browse the Internet in accordance with user instructions, including searching, linking to, receiving, and displaying web pages or portions thereof, as well as attachments and other files linked to web pages.

In conjunction with RF circuitry 1108, touch screen 1112, display system controller 1156, contact module 1130, graphics module 1132, text input module 1134, e-mail client module 1140, and browser module 1147, calendar module 1148 includes executable instructions to create, display, modify, and store calendars and data associated with calendars (e.g., calendar entries, to do lists, etc.) in accordance with user instructions.

In conjunction with RF circuitry 1108, touch screen 1112, display system controller 1156, contact module 1130, graphics module 1132, text input module 1134, and browser module 1147, widget modules 1149 are mini-applications that may be downloaded and used by a user (e.g., weather widget 1149-1, stocks widget 1149-2, calculator widget 1149-3, alarm clock widget 1149-4, and dictionary widget 1149-5) or created by the user (e.g., user-created widget 1149-6). In some embodiments, a widget includes an HTML (Hypertext Markup Language) file, a CSS (Cascading Style Sheets) file, and a JavaScript file. In some embodiments, a widget includes an XML (Extensible Markup Language) file and a JavaScript file (e.g., Yahoo! Widgets).

In conjunction with RF circuitry 1108, touch screen 1112, display system controller 1156, contact module 1130, graphics module 1132, text input module 1134, and browser module 1147, the widget creator module 1150 may be used by a user to create widgets (e.g., turning a user-specified portion of a web page into a widget).

In conjunction with touch screen 1112, display system controller 1156, contact module 1130, graphics module 1132, and text input module 1134, search module 1151 includes executable instructions to search for text, music, sound, image, video, and/or other files in memory 1102 that match one or more search criteria (e.g., one or more user-specified search terms) in accordance with user instructions.

In conjunction with touch screen 1112, display system controller 1156, contact module 1130, graphics module 1132, audio circuitry 1110, speaker 1111, RF circuitry 1108, and browser module 1147, video and music player module 1152 includes executable instructions that allow the user to download and play back recorded music and other sound files stored in one or more file formats, such as MP3 or AAC files, and executable instructions to display, present or otherwise play back videos (e.g., on touch screen 1112 or on an external, connected display via external port 1124). In some embodiments, device 1100 may include the functionality of an MP3 player.

In conjunction with touch screen 1112, display controller 1156, contact module 1130, graphics module 1132, and text input module 1134, notes module 1153 includes executable instructions to create and manage notes, to do lists, and the like in accordance with user instructions.

In conjunction with RF circuitry 1108, touch screen 1112, display system controller 1156, contact module 1130, graphics module 1132, text input module 1134, GPS module 1135, and browser module 1147, map module 1154 may be used to receive, display, modify, and store maps and data associated with maps (e.g., driving directions; data on stores and other points of interest at or near a particular location; and other location-based data) in accordance with user instructions.

In conjunction with touch screen 1112, display system controller 1156, contact module 1130, graphics module 1132, audio circuitry 1110, speaker 1111, RF circuitry 1108, text input module 1134, e-mail client module 1140, and browser module 1147, online video module 1155 includes instructions that allow the user to access, browse, receive (e.g., by streaming and/or download), play back (e.g., on the touch screen or on an external, connected display via external port 1124), send an e-mail with a link to a particular online video, and otherwise manage online videos in one or more file formats, such as H.264. In some embodiments, instant messaging module 1141, rather than e-mail client module 1140, is used to send a link to a particular online video.

Each of the above identified modules and applications correspond to a set of executable instructions for performing one or more functions described above and the methods described in this application (e.g., the computer-implemented methods and other information processing methods described herein). These modules (i.e., sets of instructions) need not be implemented as separate software programs, procedures or modules, and thus various subsets of these modules may be combined or otherwise re-arranged in various embodiments. In some embodiments, memory 1102 may store a subset of the modules and data structures identified above. Furthermore, memory 1102 may store additional modules and data structures not described above.

In some embodiments, device 1100 is a device where operation of a predefined set of functions on the device is performed exclusively through a touch screen and/or a touchpad. By using a touch screen and/or a touchpad as the primary input control device for operation of device 1100, the number of physical input control devices (such as push buttons, dials, and the like) on device 1100 may be reduced.

The predefined set of functions that may be performed exclusively through a touch screen and/or a touchpad include navigation between user interfaces. In some embodiments, the touchpad, when touched by the user, navigates device 1100 to a main, home, or root menu from any user interface that may be displayed on device 1100. In such embodiments, the touchpad may be referred to as a "menu button." In some other embodiments, the menu button may be a physical push button or other physical input control device instead of a touchpad.

FIG. 11A-B illustrates a portable multifunction device 1100 having a touch screen 1112 in accordance with some embodiments. The touch screen may display one or more graphics within a user interface (UI). In this embodiment, as well as others described below, a user may select one or more of the graphics by making a gesture on the graphics, for example, with one or more fingers 1101 (not drawn to scale in the Figure) or one or more styluses 1103 (not drawn to scale in the figure).

Device 1100 may also include one or more physical buttons, such as "home" or menu button 1104. As described previously, menu button 1104 may be used to navigate to any application 1136 in a set of applications that may be executed on device 1100. Alternatively, in some embodiments, the menu button is implemented as a soft key in a graphics user interface (GUI) displayed on touch screen 1112.

In one embodiment, device 1100 includes touch screen 1112, menu button 1104, push button 1105 for powering the device on/off and locking the device, volume adjustment button(s) 1109, Subscriber Identity Module (SIM) card slot 1110, head set jack 1114, and docking/charging external port 1124. Push button 1105 may be used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, device 1100 also may accept verbal input for activation or deactivation of some functions through microphone 1113.

It should be noted that, although many of the examples herein are given with reference to optical sensor/camera 1164 (on the front of a device), a rear-facing camera or optical sensor that is pointed opposite from the display may be used instead of or in addition to an optical sensor/camera 1164 on the front of a device.

Example Computer System

Figure 12:
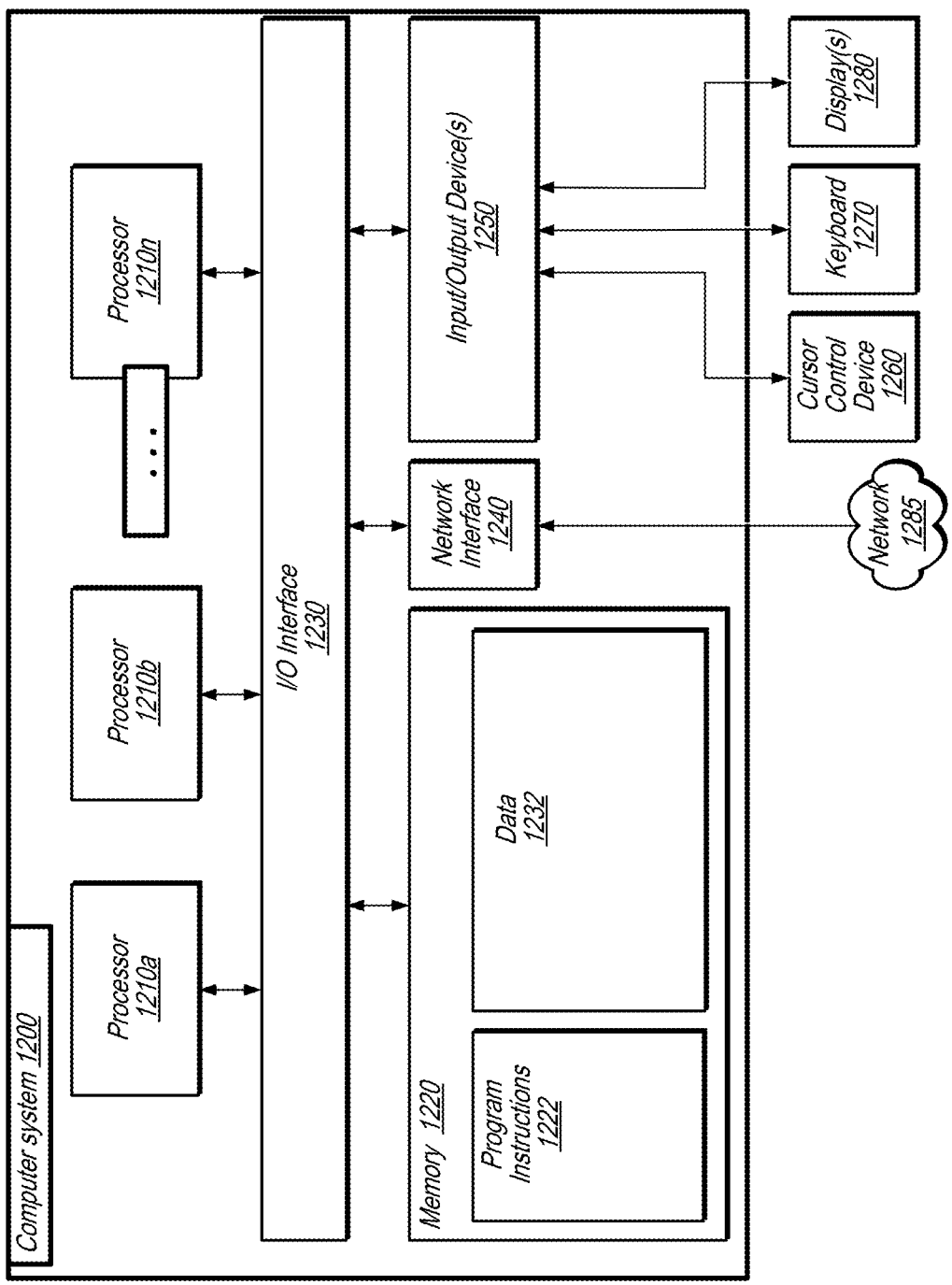
FIG. 12 illustrates an example computer system, according to some embodiments.

FIG. 12 illustrates an example computer system 1200 that may be configured to include or execute any or all of the embodiments described above. In different embodiments, computer system 1200 may be any of various types of devices, including, but not limited to, a personal computer system, desktop computer, laptop, notebook, tablet, slate, pad, or netbook computer, cell phone, smartphone, PDA, portable media device, mainframe computer system, handheld computer, workstation, network computer, a camera or video camera, a set top box, a mobile device, a consumer device, video game console, handheld video game device, application server, storage device, a television, a video recording device, a peripheral device such as a switch, modem, router, or in general any type of computing or electronic device.

Various embodiments of a light source module (e.g., the light source module 110) or a light source module controller (e.g., the controller 405 of FIG. 4) as described herein, may be executed in one or more computer systems 1200, which may interact with various other devices. Note that any component, action, or functionality described above with respect to FIGS. 1A through 10 may be implemented on one or more computers configured as computer system 1200 of FIG. 12, according to various embodiments. In the illustrated embodiment, computer system 1200 includes one or more processors 1210 coupled to a system memory 1220 via an input/output (I/O) interface 1230. Computer system 1200 further includes a network interface 1240 coupled to I/O interface 1230, and one or more input/output devices 1250, such as cursor control device 1260, keyboard 1270, and display(s) 1280. In some cases, it is contemplated that embodiments may be implemented using a single instance of computer system 1200, while in other embodiments multiple such systems, or multiple nodes making up computer system 1200, may be configured to host different portions or instances of embodiments. For example, in one embodiment some elements may be implemented via one or more nodes of computer system 1200 that are distinct from those nodes implementing other elements.

In various embodiments, computer system 1200 may be a uniprocessor system including one processor 1210, or a multiprocessor system including several processors 1210 (e.g., two, four, eight, or another suitable number). Processors 1210 may be any suitable processor capable of executing instructions. For example, in various embodiments processors 1210 may be general-purpose or embedded processors implementing any of a variety of instruction set architectures (ISAs), such as the x8 18, PowerPC, SPARC, or MIPS ISAs, or any other suitable ISA. In multiprocessor systems, each of processors 1210 may commonly, but not necessarily, implement the same ISA.

System memory 1220 may be configured to store control program instructions 1222 and/or control data accessible by processor 1210. In various embodiments, system memory 1220 may be implemented using any suitable memory technology, such as static random access memory (SRAM), synchronous dynamic RAM (SDRAM), nonvolatile/Flash-type memory, or any other type of memory. In the illustrated embodiment, program instructions 1222 may be configured to implement a control application incorporating any of the functionality described above. Additionally, existing control data of memory 1220 may include any of the information or data structures described above. In some embodiments, program instructions and/or data may be received, sent or stored upon different types of computer-accessible media or on similar media separate from system memory 1220 or computer system 1200. While computer system 1200 is described as implementing the functionality of functional blocks of previous Figures, any of the functionality described herein may be implemented via such a computer system.

In one embodiment, I/O interface 1230 may be configured to coordinate I/O traffic between processor 1210, system memory 1220, and any peripheral devices in the device, including network interface 1240 or other peripheral interfaces, such as input/output devices 1250. In some embodiments, I/O interface 1230 may perform any necessary protocol, timing or other data transformations to convert data signals from one component (e.g., system memory 1220) into a format suitable for use by another component (e.g., processor 1210). In some embodiments, I/O interface 1230 may include support for devices attached through various types of peripheral buses, such as a variant of the Peripheral Component Interconnect (PCI) bus standard or the Universal Serial Bus (USB) standard, for example. In some embodiments, the function of I/O interface 1230 may be split into two or more separate components, such as a north bridge and a south bridge, for example. Also, in some embodiments some or all of the functionality of I/O interface 1230, such as an interface to system memory 1220, may be incorporated directly into processor 1210.

Network interface 1240 may be configured to allow data to be exchanged between computer system 1200 and other devices attached to a network 1285 (e.g., carrier or agent devices) or between nodes of computer system 1200. Network 1285 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 1240 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 1250 may, in some embodiments, include one or more display terminals, keyboards, keypads, touchpads, scanning devices, voice or optical recognition devices, or any other devices suitable for entering or accessing data by one or more computer systems 1200. Multiple input/output devices 1250 may be present in computer system 1200 or may be distributed on various nodes of computer system 1200. In some embodiments, similar input/output devices may be separate from computer system 1200 and may interact with one or more nodes of computer system 1200 through a wired or wireless connection, such as over network interface 1240.

As shown in FIG. 12, memory 1220 may include program instructions 1222, which may be processor-executable to implement any element or action described above. In one embodiment, the program instructions may implement the methods described above. In other embodiments, different elements and data may be included. Note that data may include any data or information described above.

Those skilled in the art will appreciate that computer system 1200 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 1200 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1200 may be transmitted to computer system 1200 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. A mobile device, comprising:
   a camera; and
   a light source module embedded in the mobile device, the light source module comprising:
      a laser-pumped phosphor light source, the laser-pumped phosphor light source comprising:
         a photoluminescent phosphor;
         a laser diode to generate laser light within a first wavelength range to pump the photoluminescent phosphor,
         wherein exposure of the photoluminescent phosphor to the laser light results in emission of visible light within at least a second wavelength range of a first laser-pumped emission spectrum associated with the photoluminescent phosphor; and
         one or more direction control elements configured to steer the laser light from a first direction associated with a first region of the photoluminescent phosphor, to a second direction associated with a second region of the photoluminescent phosphor.

2. The mobile device of claim 1, wherein the first region of the photoluminescent phosphor is associated with a particular optical element configured to receive light from the first region, and the second region of the photoluminescent phosphor is associated with a different optical element configured to receive light from the second region.

3. The mobile device of claim 2, wherein the particular optical element is one of:
   a first optical element associated with a first field-of-view (FOV) design for a laser flash module;
   a second optical element associated with a second FOV design for a laser flash module;
   a third optical element associated with a FOV visual field indicator (VFI) design for a laser flash module, the FOV VFI design to enable illumination of edges of a corresponding FOV for the camera; or
   a fourth optical element associated with a spot light design for a laser flash module.

4. The mobile device of claim 3, wherein the different optical element differs from the particular optical element and the different optical element is another one of the first optical element, the second optical element, the third optical element, or the fourth optical element.

5. The mobile device of claim 2, wherein the one or more direction control elements are configured to direct the laser light in the first direction to the first region of the photoluminescent phosphor, and the first region of the photoluminescent phosphor is configured to provide first visible light to the particular optical element responsive to receiving the laser light.

6. The mobile device of claim 2, wherein the second region of the photoluminescent phosphor is configured to provide second visible light to the different optical element responsive to receiving the laser light steered by the one or more direction control elements from the first direction to the second direction.

7. The mobile device of claim 1, wherein the first region of the photoluminescent phosphor has a respective phosphor characteristic that differs from a respective phosphor characteristic of the second region of the photoluminescent phosphor.

8. A light source module for a camera, the light source module comprising:
   a laser-pumped phosphor light source, the laser-pumped phosphor light source comprising:
      a photoluminescent phosphor; and
      a laser diode to generate laser light within a first wavelength range to pump the photoluminescent phosphor,
      wherein exposure of the photoluminescent phosphor to the laser light results in emission of visible light within at least a second wavelength range of a first laser-pumped emission spectrum associated with the photoluminescent phosphor; and
      one or more direction control elements configured to steer the laser light from a first direction associated with a first region of the photoluminescent phosphor, to a second direction associated with a second region of the photoluminescent phosphor.

9. The light source module of claim 8, wherein the first region of the photoluminescent phosphor is associated with a particular optical element configured to receive light from the first region and the second region of the photoluminescent phosphor is associated with a different optical element configured to receive light from the second region.

10. The light source module of claim 8, wherein the first region of the photoluminescent phosphor has a respective phosphor characteristic that differs from a respective phosphor characteristic of the second region of the photoluminescent phosphor.

11. The light source module of claim 8, further comprising a mirror, wherein the one or more direction control elements are configured to direct the laser light toward the mirror that is oriented to re-direct the laser light toward the second region of the photoluminescent phosphor.

12. The light source module of claim 9, wherein the one or more direction control elements are further configured to direct the laser light to the first region, wherein the first region of the photoluminescent phosphor is configured to provide first visible light to the particular optical element responsive to the laser light being directed to the first region, and the second region of the photoluminescent phosphor is configured to provide second visible light to the different optical element responsive to steering, by the one or more direction control elements, the laser light from the first direction to the second direction.

13. The light source module of claim 12, wherein the particular optical element is one of:
 a first optical element associated with a first field-of-view (FOV) design for a laser flash module;
 a second optical element associated with a second FOV design for a laser flash module;
 a third optical element associated with a FOV visual field indicator (VFI) design for a laser flash module, the FOV VFI design to enable illumination of edges of a corresponding FOV for the camera; or
 a fourth optical element associated with a spot light design for a laser flash module.

14. The light source module of claim 13, wherein the different optical element is a different one of the first optical element, the second optical element, the third optical element, or the fourth optical element.

15. A method, performed by a mobile device, the method comprising:
 activating a light source module embedded in a mobile device, the light source module including:
  a laser-pumped phosphor light source of a plurality of light sources of the light source module, the laser-pumped phosphor light source comprising:
   a photoluminescent phosphor; and
   a laser diode to generate laser light within a first wavelength range to pump the photoluminescent phosphor,
   wherein exposure of the photoluminescent phosphor to the laser light results in emission of visible light within at least a second wavelength range of a first laser-pumped emission spectrum associated with the photoluminescent phosphor; and
  one or more direction control elements configured to direct the laser light to individual ones of a plurality of regions of the photoluminescent phosphor; and
 steering the laser light from a first direction associated with a first region of the photoluminescent phosphor, to a second direction associated with a second region of the photoluminescent phosphor.

16. The method of claim 15, wherein individual regions of a plurality of regions of the photoluminescent phosphor have a respective phosphor characteristic, wherein the first region of the photoluminescent phosphor has a respective phosphor characteristic that is different from the respective phosphor characteristic of the second region of the photoluminescent phosphor.

17. The method of claim 15, wherein steering the laser light from the first direction to the second direction further comprises directing the laser light, by the one or more direction control elements, toward a mirror that re-directs the laser light to the second region.

18. The method of claim 15, further comprising directing the laser light to the first region of the photoluminescent phosphor, and providing, by the first region of the photoluminescent phosphor responsive to the laser light having been directed to the first region, first visible light emitted from the first region to a particular optical element.

19. The method of claim 18, wherein the particular optical element is one of:
 a first optical element associated with a first field-of-view (FOV) design for a laser flash module;
 a second optical element associated with a second FOV design for a laser flash module;
 a third optical element associated with a FOV visual field indicator (VFI) design for a laser flash module, the FOV VFI design to enable illumination of edges of a corresponding FOV for a camera; or
 a fourth optical element associated with a spot light design for a laser flash module.

20. The method of claim 19, further comprising:
 responsive to steering by the one or more direction control elements of the laser light from the first direction toward the second direction, providing, by the second region responsive to receipt of the laser light, second visible light toward a different optical element, wherein the different optical element is a different one of the first optical element, the second optical element, the third optical element, or the fourth optical element.

* * * * *